US011990549B2

(12) United States Patent
Jung et al.

(10) Patent No.: US 11,990,549 B2
(45) Date of Patent: May 21, 2024

(54) SEMICONDUCTOR DEVICE INCLUDING ACTIVE REGION AND GATE STRUCTURE

(71) Applicant: SAMSUNG ELECTRONICS CO., LTD., Suwon-si (KR)

(72) Inventors: Joohee Jung, Seoul (KR); Jinbum Kim, Seoul (KR); Dongil Bae, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 37 days.

(21) Appl. No.: 17/716,005

(22) Filed: Apr. 8, 2022

(65) Prior Publication Data

US 2022/0231159 A1  Jul. 21, 2022

Related U.S. Application Data

(63) Continuation of application No. 16/866,628, filed on May 5, 2020, now Pat. No. 11,302,815.

(30) Foreign Application Priority Data

Aug. 5, 2019  (KR) .................. 10-2019-0094901

(51) Int. Cl.
*H01L 29/78*  (2006.01)
*H01L 27/088*  (2006.01)
(Continued)

(52) U.S. Cl.
CPC ........ *H01L 29/785* (2013.01); *H01L 27/0886* (2013.01); *H01L 29/0649* (2013.01);
(Continued)

(58) Field of Classification Search
CPC ............... H01L 29/785; H01L 27/0886; H01L 29/0649; H01L 29/41791; H01L 29/66795;
(Continued)

(56) References Cited

U.S. PATENT DOCUMENTS 7,288,802 B2  10/2007  Anderson et al.
8,154,082 B2   4/2012  Moriyama et al.
(Continued)

FOREIGN PATENT DOCUMENTS

KR    10-2015-0021448    3/2015

OTHER PUBLICATIONS

Office Action in Korean Appln No. KR10-2019-0094901, mailed on Feb. 19, 2024, 10 pages (with English translation).

*Primary Examiner* — Farun Lu
(74) *Attorney, Agent, or Firm* — Fish & Richardson P.C.

(57) ABSTRACT

A semiconductor device includes an active region extending from a substrate in a vertical direction, source/drain regions spaced apart from each other on the active region, a fin structure between the source/drain regions on the active region, the fin structure including a lower semiconductor region on the active region, a stack structure having alternating first and second semiconductor layers on the lower semiconductor region, a side surface of at least one of the first semiconductor layers being recessed, and a semiconductor capping layer on the stack structure, an isolation layer covering a side surface of the active region, a gate structure overlapping the fin structure and covering upper and side surfaces of the fin structure, the semiconductor capping layer being between the gate structure and each of the lower semiconductor region and stack structure, and contact plugs electrically connected to the source/drain regions.

14 Claims, 22 Drawing Sheets

(51) Int. Cl.
*H01L 29/06* (2006.01)
*H01L 29/417* (2006.01)
*H01L 29/66* (2006.01)

(52) U.S. Cl.
CPC .. *H01L 29/41791* (2013.01); *H01L 29/66795* (2013.01); *H01L 2029/7858* (2013.01)

(58) Field of Classification Search
CPC ......... H01L 2029/7858; H01L 29/0847; H01L 29/41766; H01L 29/0673; H01L 29/1054; H01L 29/165; H01L 29/42392; H01L 29/66439; H01L 29/775; H01L 29/78696; H01L 29/7827; H01L 29/1037; H01L 29/66666; H01L 29/78; H01L 21/02532; H01L 21/762; H01L 21/76831; H01L 21/76837; H01L 21/76897; H01L 21/823418; H01L 21/823462; H01L 21/823487; B82Y 10/00
See application file for complete search history.

(56) References Cited

U.S. PATENT DOCUMENTS

| | | | |
|---|---|---|---|
| 8,629,478 | B2 | 1/2014 | Ko et al. |
| 9,257,450 | B2 | 2/2016 | Loubet et al. |
| 9,406,782 | B2 | 8/2016 | Yu et al. |
| 9,660,033 | B1 | 5/2017 | Chen et al. |
| 9,853,101 | B2 | 12/2017 | Peng et al. |
| 10,008,583 | B1 | 6/2018 | Rodder et al. |
| 2015/0053928 | A1 | 2/2015 | Ching et al. |
| 2016/0172445 | A1* | 6/2016 | Kim ...................... H01L 29/785 257/401 |
| 2019/0279911 | A1* | 9/2019 | Cheng ............... H01L 29/42392 |
| 2020/0365703 | A1* | 11/2020 | Chung ................ H01L 27/0886 |

* cited by examiner

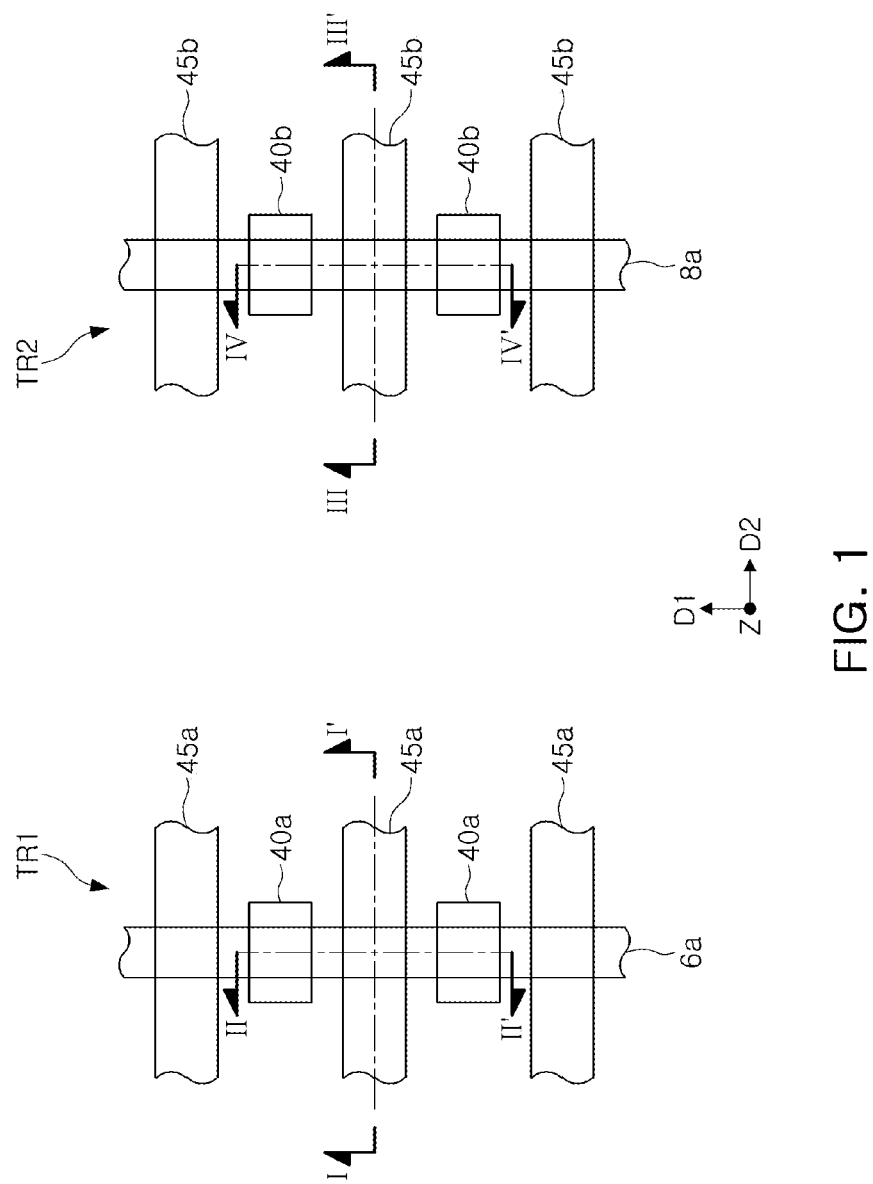

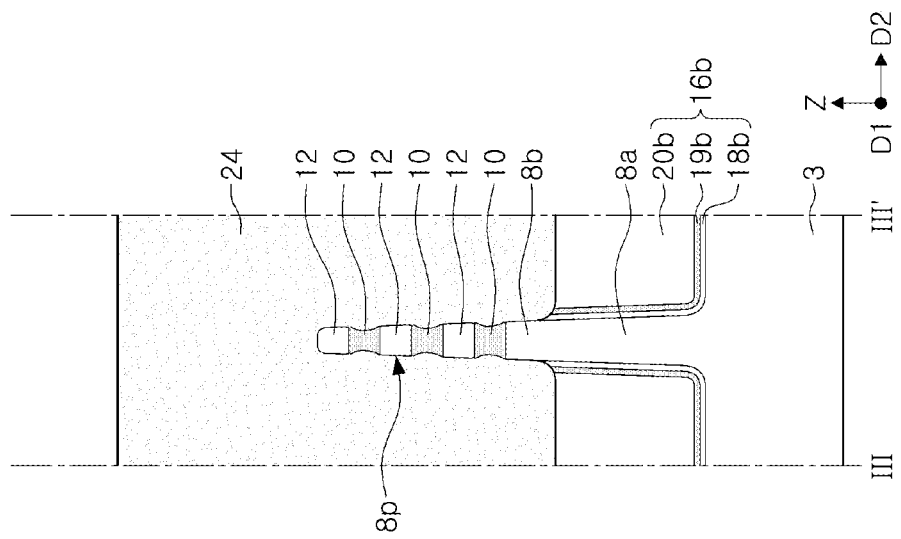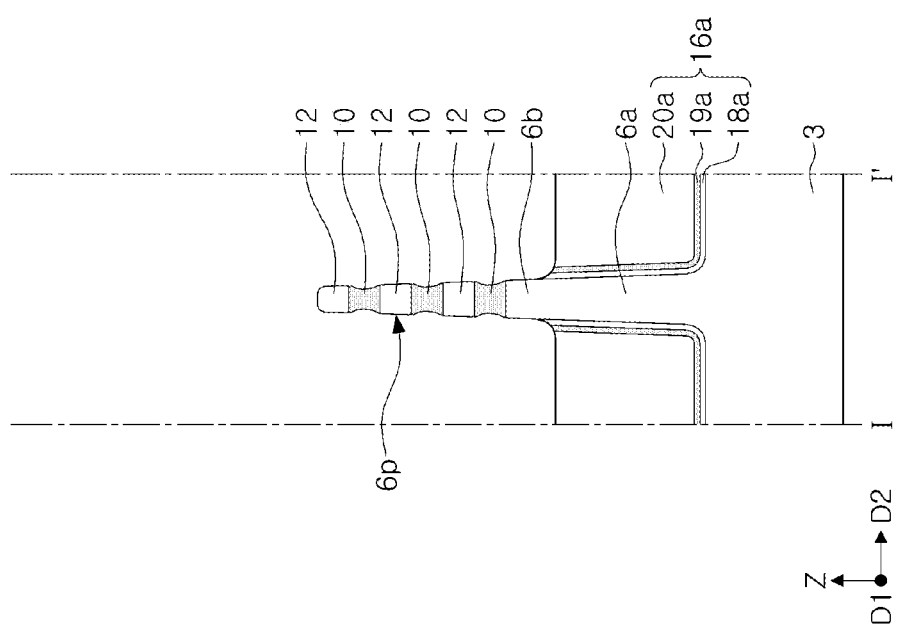
FIG. 15A

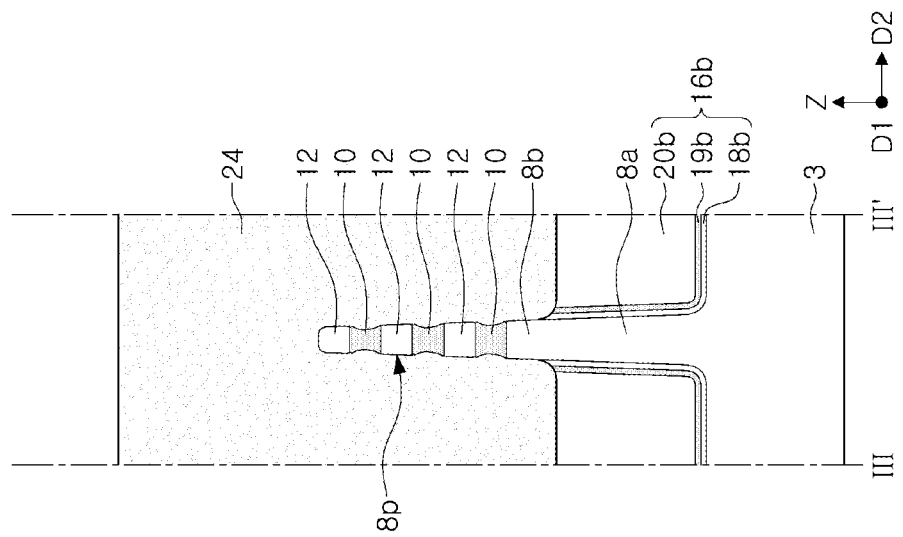
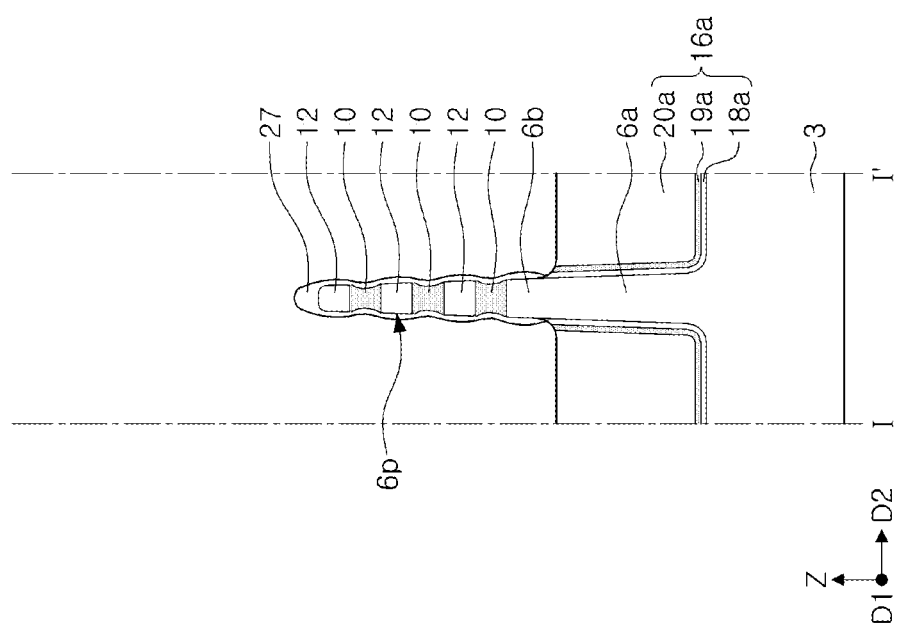
FIG. 15B

SEMICONDUCTOR DEVICE INCLUDING ACTIVE REGION AND GATE STRUCTURE

CROSS-REFERENCE TO RELATED APPLICATION

This application is a continuation of U.S. patent application Ser. No. 16/866,628 filed May 5, 2020, which is incorporated by reference herein in its entirety.

Korean Patent Application No. 10-2019-0094901, filed on Aug. 5, 2019, in the Korean Intellectual Property Office, and entitled: "Semiconductor Device Including Active Region and Gate Structure," is incorporated by reference herein in its entirety.

BACKGROUND

1. Field

The present disclosure relates to semiconductor devices, and more particularly, to a semiconductor device having an active region and a gate structure.

2. Description of the Related Art

As demand for high performance, high speed and/or multifunctionality in semiconductor devices is increased, the degree of integration of semiconductor devices is increasing. In order to address the limitations of operating characteristics caused by a reduction in size of a planar MOSFET, various efforts are underway to develop a MOSFET including a channel having a three-dimensional structure.

SUMMARY

According to an example embodiment, a semiconductor device includes a first active region extending from a semiconductor substrate in a vertical direction, the first active region extending in a first direction, parallel to an upper surface of the semiconductor substrate, first source/drain regions spaced apart from each other in the first direction on the first active region, a fin structure between the first source/drain regions on the first active region, the fin structure having a first lower semiconductor region extending from the first active region, a stack structure on the first lower semiconductor region, the stack structure including alternating first and second semiconductor layers stacked in the vertical direction, and a side surface of at least one first semiconductor layer of the alternating first and second semiconductor layers being recessed in a second direction perpendicular to the first direction, and a semiconductor capping layer on the stack structure, a first isolation layer covering a side surface of the first active region on the semiconductor substrate, a first gate structure overlapping the fin structure and extending in the second direction to cover an upper surface of the fin structure and side surfaces of the fin structure in the second direction, the semiconductor capping layer being between the first gate structure and the stack structure and between the first gate structure and the first lower semiconductor region, and first contact plugs electrically connected to the first source/drain regions.

According to an example embodiment, a semiconductor device includes an isolation layer defining an active region on a semiconductor substrate, source/drain regions on the active region, a fin structure extending from the active region in a vertical direction, perpendicular to an upper surface of the semiconductor substrate, and disposed between the source/drain regions, and a gate structure overlapping the fin structure and extending upwardly of the isolation layer. The active region extends in a first direction, parallel to the upper surface of the semiconductor substrate. The source/drain regions are in contact with side surfaces of the fin structure in the first direction. The gate structure covers side surface of the fin structure in a second direction and an upper surface of the fin structure. The second direction is perpendicular to the first direction. The fin structure includes a lower semiconductor region extending from the active region in the vertical direction, a stack structure on the lower semiconductor region, and a portion between at least the gate structure and the stack structure. The stack structure includes a plurality first semiconductor layers and a plurality of second semiconductor layers, alternately stacked in the vertical direction. Among side surfaces of the fin structure, at least one side surface overlaps a portion of the isolation layer.

According to an example embodiment, a semiconductor device includes a shallow isolation layer defining a plurality of active regions on a semiconductor substrate, source/drain regions on the plurality of active regions, fin structures extending from the plurality of active regions in a vertical direction, perpendicular to an upper surface of the semiconductor substrate and disposed to be in contact with the source/drain regions, and a gate structure overlapping the fin structure and extending upwardly of the shallow isolation layer. Each of the plurality of active regions extends in a first direction, parallel to the upper surface of the semiconductor substrate. The source/drain regions are in contact with side surfaces of the fin structure in the first direction. The gate structure covers side surfaces of the fin structures in a second direction and upper surface of the fin structures. The second direction is perpendicular to the first direction. Each of the fin structures includes a lower semiconductor region extending from the active regions in the vertical direction, a stack structure on the lower semiconductor region, and a semiconductor capping layer covering side surfaces of the stack structure in the second direction. The stack structure includes a plurality of first semiconductor layers and a plurality of second semiconductor layers, alternately stacked in the vertical direction. The plurality of second semiconductor layers include a material different from a material of the plurality of first semiconductor layers. Side surfaces of the plurality of first semiconductor layers in the second direction are concave further than side surfaces of the plurality of second semiconductor layers in the second direction. In at least one of the plurality of first semiconductor layers, a width of a central portion in the second direction is less than a width of each of an upper surface and a lower surface in the second direction.

BRIEF DESCRIPTION OF DRAWINGS

Features will become apparent to those of skill in the art by describing in detail exemplary embodiments with reference to the attached drawings, in which:

FIG. 1 illustrates a plan view of a semiconductor device according to example embodiments;

FIGS. 15A and 15B illustrate cross-sectional views of stages in another example of a method of forming a semiconductor device according to example embodiments.

DETAILED DESCRIPTION

Hereinafter, example embodiments will be described with reference to the accompanying drawings.

An example of a semiconductor device according to an example embodiment will be described with reference to FIGS. 1, 2A, and 2B. FIG. 1 is a plan view of a semiconductor device according to example embodiments, FIG. 2A is a cross-sectional view, taken along lines I-I' and II-II' in FIG. 1, illustrating an example of a semiconductor device according to an example embodiment, and FIG. 2B is a cross-sectional view, taken along lines and IV-IV' in FIG. 1, illustrating an example of a semiconductor device according to an example embodiment.

Figure 2A:
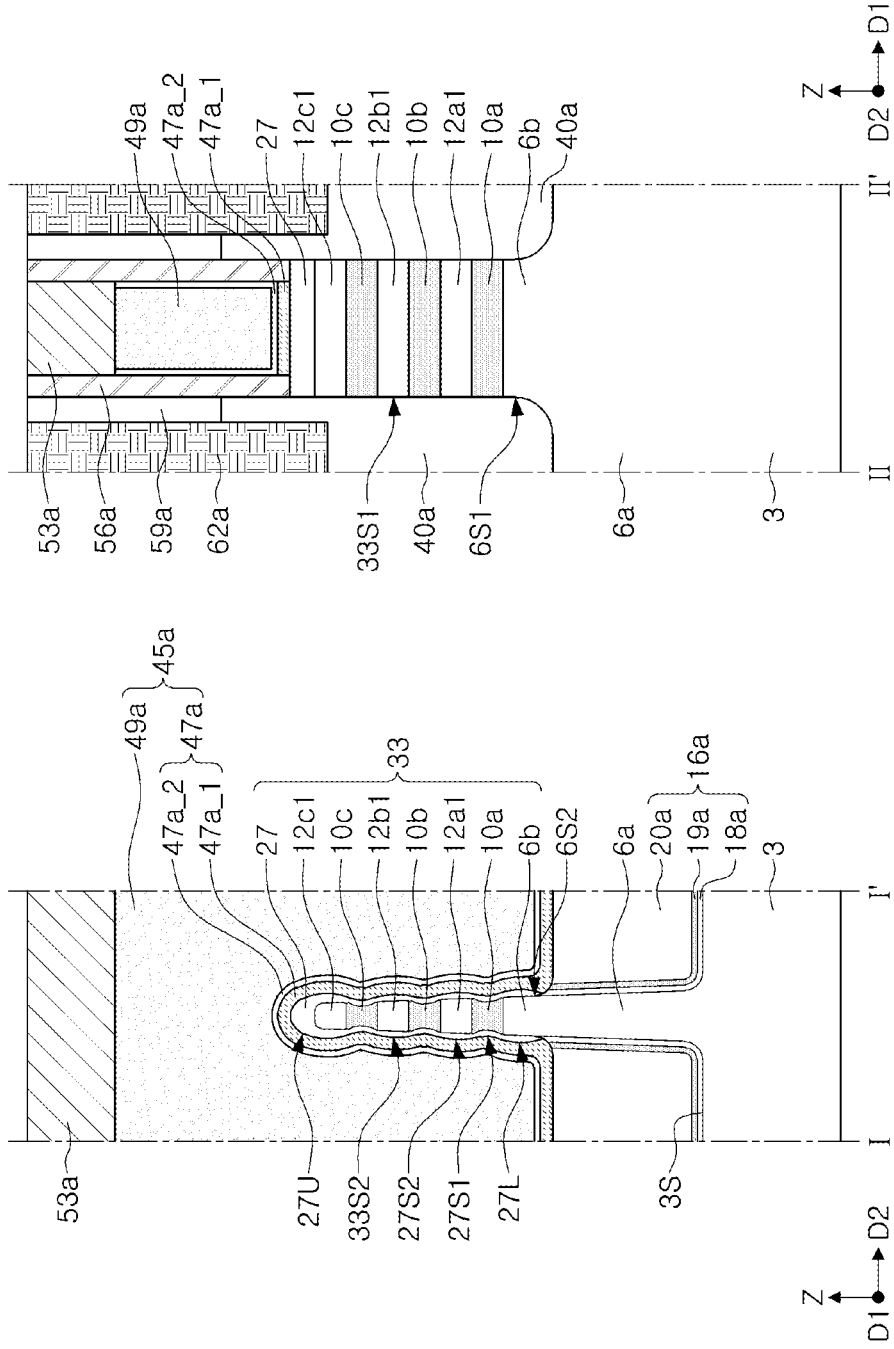
FIGS. 2A and 2B illustrate cross-sectional views according to an example embodiment.
Figure 2B:
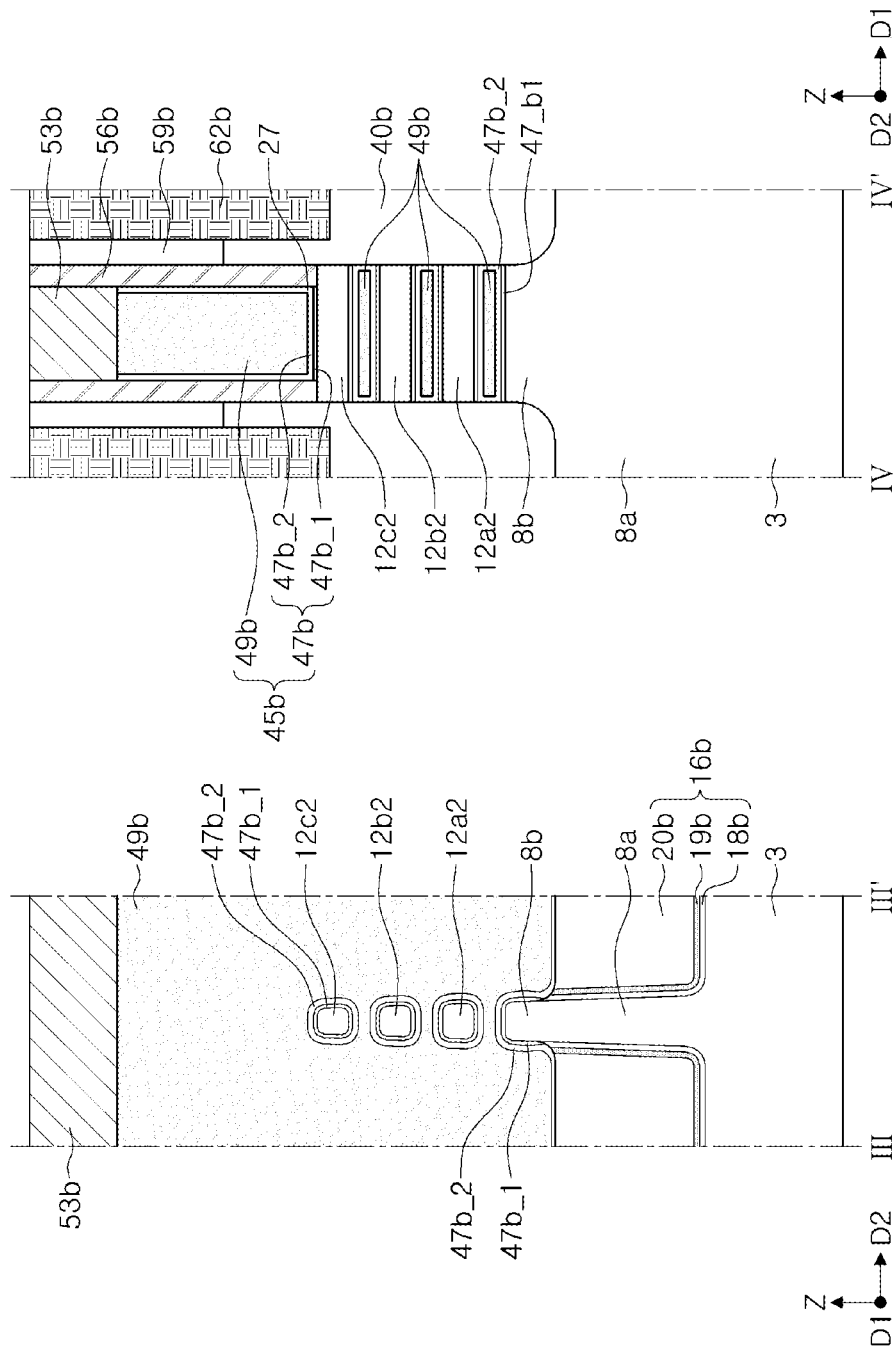

Referring to FIGS. 1 and 2A, a first active region 6a protruding from a semiconductor substrate 3 in a vertical direction Z and extending in a first direction D1, a fin structure 33 on the first active region 6a, a first gate structure 45a overlapping the fin structure 33, and first source/drain regions 40a on the first active region 6a may be disposed in a first transistor region TR1. The fin structure 33 may include a first lower semiconductor region 6b, stack structures 10a, 10b, 10c, 12a1, 12b1, and 12c1, and a semiconductor capping layer 27.

The semiconductor substrate 3 may be, e.g., a silicon substrate. The vertical direction Z may be a direction perpendicular to an upper surface 3S of the semiconductor substrate 3. The first active region 6a may extend in the first direction D1 parallel to the upper surface 3S of the semiconductor substrate 3.

A first isolation layer 16a may be disposed on the semiconductor substrate 3 to cover side surfaces of the first active region 6a. The first isolation layer 16a may include a first buffer insulating layer 18a covering the upper surface 3S of the semiconductor substrate 3 and side surfaces of the first active region 6a, a first insulating liner 19a covering the first buffer insulating layer 18a, and a first gap-fill insulating layer 20a covering the first insulating liner 19a.

The fin structure 33 may have first side surfaces 33S1 in the first direction D1 and second side surfaces 33S2 in a second direction D2 perpendicular to the first direction D1. The second direction D2 may be parallel to the upper surface 3S of the semiconductor substrate 3.

Throughout the specification, "the side surfaces in the first direction D1" may refer to side surfaces arranged in the first direction D1, and "the side surfaces in the second direction D2" may refer to side surfaces arranged in the second direction D2. For example, as illustrated in FIGS. 1 and 2A, "side surfaces in the first direction D1" may have longitudinal directions that extend in the first direction D1, and "side surfaces in the second direction D2" may have longitudinal directions that extend in the second direction D2.

The fin structure 33 may include a portion extending from the first active region 6a in the vertical direction Z. For example, the first lower semiconductor region 6b of the fin structure 33 may extend, e.g., continuously and integrally, from the first active region 6a in the vertical direction Z. Therefore, the first lower semiconductor region 6b may be formed of the same material as the first active region 6a, e.g., silicon.

The stack structures 10a, 10b, 10c, 12a1, 12b1, and 12c1 of the fin structure 33 may include a plurality of first semiconductor layers 10a, 10b, and 10c and a plurality of second semiconductor layers 12a1, 12b1 and 12c1, alternately stacked on the first lower semiconductor region 6b.

The plurality of first semiconductor layers 10a, 10b, and 10c may include a first silicon-germanium layer 10a, a second silicon-germanium layer 10b, and a third silicon-germanium layer 10c, spaced apart from each other in the vertical direction Z. The first silicon-germanium layer 10a may be in, e.g., direct, contact with the first lower semiconductor region 6b.

The plurality of second semiconductor layers 12a1, 12b1, and 12c1 may include a first silicon layer 12a1, a second silicon layer 12b1, and a third silicon layer 12c1 spaced apart from each other in the vertical direction Z. The first silicon layer 12a1 may be interposed between the first silicon-germanium layer 10a and the second silicon-germanium layer 10b, the second silicon layer 12b1 may be interposed between the second silicon-germanium layer 10b and the third silicon-germanium layer 10c, and the third silicon layer 12c1 may disposed on an upper surface of the third silicon-germanium layer 10c.

In an example, the first silicon-germanium layer 10a, the second silicon-germanium layer 10b, and the third silicon-germanium layer 10c may have the same first thickness, e.g., along the vertical direction Z. In an example, the first lower semiconductor region 6b may have a thickness, e.g., as measured from the upper surface 3S of the semiconductor substrate 3 along the vertical direction Z, greater than the thickness of each of the plurality of first semiconductor layers 10a, 10b, and 10c. In an example, at least one of the plurality of second semiconductor layers 12a1, 12b1, and 12c1 may have a thickness, e.g., along the vertical direction Z, less than the thickness of each of the plurality of first semiconductor layers 10a, 10b, and 10c.

The semiconductor capping layer 27 of the fin structure 33 may be interposed between the first gate structure 45a and the stack structures 10a, 10b, 10c, 12a1, 12b1, 12c1, and may extend between the first gate structure 45a and the first lower semiconductor region 6b. The semiconductor capping layer 27 may cover, e.g., continuously, side surfaces 6S2 of the first lower semiconductor region 6b in the second direction D2, side surfaces of the stack structures 10a, 10b, 10c, 12a1, 12b1, and 12c1 in the second direction D2, and upper surfaces of the stack structures 10a, 10b, 10c, 12a1, 12b1, and 12c1. For example, as illustrated in FIG. 2A, the semiconductor capping layer 27 may be continuous and conformal on all surfaces of the stacked structures 6b, 10a, 10b, 10c, 12a1, 12b1, 12c1 that extend above the upper surface 3S of the semiconductor substrate 3, e.g., so the semiconductor capping layer 27 may completely separate the first gate structure 45a from the stacked structures 6b, 10a, 10b, 10c, 12a1, 12b1, 12c1 in the fin structure 33.

In an example, among the plurality of first semiconductor layers 10a, 10b, and 10c and the plurality of second semiconductor layers 12a1, 12b1, and 12c1, a lowermost layer may be a lowermost first semiconductor layer 10a. In the semiconductor capping layer 27, a portion 27L, covering the side surface of the first lower semiconductor region 6b, may have a maximum thickness, e.g., along the second direction D2, different from a minimum thickness, e.g., along the second direction D2, of a portion 27S1 covering the side surface of the lowermost first semiconductor layer 10a. For example, in the semiconductor capping layer 27, the portion 27L, covering the side surface of the first lower semiconductor region 6b, may have a maximum thickness greater than a minimum thickness of the portion 27S1 covering the side surface of the lowermost first semiconductor layer 10a.

In an example, in the semiconductor capping layer 27, the portion 27L, covering the first lower semiconductor region 6b, may have a maximum thickness greater than a minimum thickness of each of portions 27S1 covering the plurality of first semiconductor layers 10a, 10b, and 10c.

In an example, in the semiconductor capping layer 27, each of the portions 27S1, covering the plurality of first semiconductor layers 10a, 10b, and 10c, may have a thickness different from a thickness of each of portions 27S2 covering the plurality of second semiconductor layers 12a1, 12b1, and 12c1.

In an example, in the semiconductor capping layer 27, a thickness of the semiconductor capping layer 27 in the vertical direction Z, disposed on the uppermost second semiconductor layer 12c1 among the plurality of second semiconductor layers 12a1, 12b1, and 12c1, may be approximately 4 nm or more, and a thickness of each of the portions 27S1 of the semiconductor capping layer 27, e.g., along the second direction D2, covering the plurality of first semiconductor layers 10a, 10b, and 10c, may be approximately 2 nm or less. Therefore, in the semiconductor capping layer 27, the thickness of the semiconductor capping layer 27, disposed on the uppermost second semiconductor layer 12c, in the vertical direction Z, among the plurality of second semiconductor layers 12a1, 12b1, and 12c1 may be greater than or equal to twice the thickness of each of the portions 27S1 of the semiconductor capping layer 27, e.g., along the second direction D2, covering the plurality of first semiconductor layers 10a, 10b, and 10c. For example, the semiconductor capping layer 27 may include a first portion 27U on an upper surface of an uppermost second semiconductor layer 12c1 of the alternating first and second semiconductor layers 10a, 10b, 10c 12a1, 12b1 and 12c1 and second portions 27S1 contacting the first semiconductor layers 10a, 10b and 10c. A thickness of the first portion in the vertical direction Z may be greater than or equal to twice a thickness of at least one of the second portions in the second direction D2.

Each of the plurality of first semiconductor layers 10a, 10b, and 10c may have a thickness, e.g., along the vertical direction Z, greater than a thickness of the semiconductor capping layer 27, e.g., along the vertical direction Z in a region on the uppermost second semiconductor layer 12c.

Each of the plurality of second semiconductor layers 12a1, 12b1, and 12c1 may have a thickness, e.g., along the vertical direction Z, greater than a thickness of the semiconductor capping layer 27, e.g., along the vertical direction Z in a region on the uppermost second semiconductor layer 12c1.

In the semiconductor capping layer 27, a thickness of the semiconductor capping layer 27 on the uppermost second semiconductor layer 12c1 in the vertical direction Z among the plurality of second semiconductor layers 12a1, 12b1, and 12c1 may be greater than or equal to twice the thickness of each of the portions 27S1 of the semiconductor capping layer 27, e.g., along the second direction D2, covering side surfaces of the first and second silicon layers 12a1 and 12b, among the plurality of second semiconductor layers 12a1, 12b1, and 12c.

At least one of the plurality of first semiconductor layers 10a, 10b, and 10c may have concave side surfaces, such that a width of a central portion in the second direction D2 is narrower than widths of an upper portion and a lower portion in the second direction D2. For example, each of the plurality of first semiconductor layers 10a, 10b, and 10c may have concave side surfaces, e.g., side surfaces that curve toward respective centers of the plurality of first semiconductor layers 10a, 10b, and 10c.

At least one of the side surfaces 33S2 of the fin structure 33 in the second direction D2 may protrude, in the second direction D2, further than one of the side surfaces of the first active region 6a in the second direction D2 to overlap a portion of the isolation layer 16a. For example, the side surfaces 33S2 of the fin structure 33 in the second direction D2 may protrude, in the second direction D2, further than side surfaces of the first active region 6a, adjacent to the side surfaces 33S2 of the fin structure 33 in the second direction D2, to overlap a portion of the first isolation layer 16a.

For example, referring to FIG. 2A, a portion of the semiconductor capping layer 27 is a portion of the fin structure 33 that protrudes in the second direction D2 beyond surfaces of the first active region 6a. For example, a portion of the semiconductor capping layer 27, covering the first lower semiconductor region 6b, may overlap a portion of the first isolation layer 16a.

In an example, at least one of the side surfaces 33S2 of the fin structure 33 in the second direction D2 may overlap an upper end of the first buffer insulating layer 18a. In an example, side surfaces 33S2 of the fin structure 33 in the second direction D2 may overlap an upper end of the first buffer insulating layer 18a and may not overlap the first gap-fill insulating layer 20a. In an example, the semiconductor capping layer 27 of the fin structure 33 may overlap an upper end of the first buffer insulating layer 18a and may not overlap the first gap-fill insulating layer 20a.

In an example, the fin structure 33 may include a region having a width gradually increasing in the second direction D2, as a distance in the vertical direction Z from the semiconductor substrate 3 increases, and then decreasing. For example, an upper region 27U of the fin structure 33 may have a width gradually increasing and then decreasing along the second direction D2, as the distance along the vertical direction Z from the semiconductor substrate 3 increases.

In an example, the plurality of first semiconductor layers 10a, 10b, and 10c may not overlap the first isolation layer 16a. In an example, the plurality of second semiconductor layers 12a1, 12b1, and 12c1 may not overlap the first isolation layer 16a.

The first gate structure 45a may extend upwardly of, e.g., above, the isolation layer 16a while covering an upper surface of the fin structure 33, and side surfaces 33S2 of the fin structure 33 in the second direction D2. The first gate structure 45a may include a first gate dielectric layer 47a and a first gate electrode 49a on the first gate dielectric layer 47a.

The first gate dielectric layer 47a may be in contact with an upper surface of the first isolation layer 16a, side surfaces of the fin structure 33 in the second direction D2, and the upper surface of the fin structure 33. The first gate dielectric layer 47a may have a thickness greater than a thickness of the semiconductor capping layer 27, e.g., in the second direction D2.

In an example, the first gate dielectric layer 47a may include a first material layer 47a_1 and a second material layer 47a_2 on the first material layer 47a_1. The second material layer 47a_2 may extend upwardly of a side surface of the first gate electrode 49a. The first material layer 47a_1 may be formed of, e.g., a silicon oxide, and the second material layer 47a_2 may be formed of, e.g., a high-k dielectric.

The first material layer 47a_1 of the first gate dielectric layer 47a of the first gate structure 45a may be formed of an oxidation oxide and a deposition oxide. For example, forming the first material layer 47a_1 of the first gate dielectric layer 47a of the first gate structure 45a may include oxidizing a surface of the semiconductor capping layer 27 to form an oxidation oxide and performing a deposition process on the oxidation oxide to form a deposition oxide. In an example, the first material layer 47a_1 may have a thickness greater than a thickness of the second material layer 47a_2.

A first gate capping layer 53a may be disposed on the first gate structure 45a. The first gate capping layer 53a may be formed of an insulating material, e.g., a silicon nitride, or the like.

First gate spacers 56a may be disposed on side surfaces of the first gate structure 45a and the first gate capping layer 53a. The first gate spacers 56a may be disposed on the semiconductor capping layer 27 of the fin structure 33.

The first source/drain regions 40a may be in contact with the side surfaces 33S1 of the fin structure 33 in the first direction D1. First contact plugs 62a may be disposed on opposite sides adjacent to the first gate structure 45a to be electrically connected to the first source/drain regions 40a. In an example, a first insulating layer 59a may be disposed between the first contact plugs 62a and the first gate spacers 56a.

Referring to FIG. 2B together with FIGS. 1 and 2A, a second active region 8a protruding from the semiconductor substrate 3 in the vertical direction Z, a second lower semiconductor region 8b extending from the second active region 8a in the vertical direction Z, a plurality of semiconductor channel layers 12a2, 12b2, and 12c2 spaced apart from each other in the vertical direction Z on the lower semiconductor region 8b, a second gate structure 45b overlapping the plurality of semiconductor channel layers 12a2, 12b2, and 12c2, and second source/drain regions 40b on the second active region 8a may be disposed in a second transistor region TR2.

The second active region 8a may be spaced apart from the first active region 6a. The second active region 8a may extend in the first direction D1.

A second isolation layer 16b may be disposed to cover the upper surface 3S of the semiconductor substrate 3 and side surfaces of the second active region 8a. The second isolation layer 16b includes a second buffer insulating layer 18b covering the side surfaces of the second active regions 8a, a second insulating liner 19b covering the second buffer insulating layer 18b, and a second gap-fill insulating layer 20b covering the second insulating liner 19b.

The first buffer insulating layer 18a and the second buffer insulating layer 18b may be formed of the same material, e.g., silicon oxide. The first insulating liner 19a and the second insulating liner 19b may be formed of the same material, e.g., silicon nitride. The first gap-fill insulating layer 20a and the second gap-fill insulating layer 20b may be formed of the same material, e.g., silicon oxide.

The plurality of semiconductor channel layers 12a2, 12b2, and 12c2 may include a first semiconductor channel layer 12a2 on the second lower semiconductor region 8b, a second semiconductor channel layer 12b2 on the first semiconductor channel layer 12a2, and a third semiconductor channel layer 12c2 on the second semiconductor channel layer 122b.

Each of the plurality of semiconductor channel layers 12a2, 12b2, and 12c2 may have substantially the same thickness, e.g., along the vertical direction Z, as a thickness of each of the plurality of second semiconductor layers 12a1, 12b1, and 12c1. The plurality of semiconductor channel layers 12a2, 12b2, and 12c2 and the plurality of second semiconductor layers 12a1, 12b1, and 12c1 may be formed of the same material, e.g., an epitaxially grown silicon material.

The second gate structure 45b may overlap the plurality of semiconductor channel layers 12a2, 12b2, and 12c2 and may extend in the second direction D2 to be disposed on the second isolation layer 16b. The second gate structure 45b may cover the upper surface of the second lower semiconductor region 8b and the side surfaces of the second lower semiconductor region 8b in the second direction D2 while extending in the second direction D2, and may surround each of the plurality of semiconductor channel layers 12a2, 12b2, and 12c2. The second gate structure 45b may cover an upper surface, a lower surface of each of the plurality of semiconductor channel layers 12a2, 12b2, and 12c2, and a side surface of each of the plurality of semiconductor channel layers 12a2, 12b2, and 12c2 in the second direction while extending in the second direction D2.

The second gate structure 45b may include a second gate dielectric layer 47b and a second gate electrode 49b. In an example, the first gate dielectric layer 47a may have a thickness greater than a thickness of the second gate dielectric layer 47b.

The second gate dielectric layer 47b may include a third material layer 47b_1 and a fourth material layer 47b_2. The fourth material layer 47b_2 of the second gate dielectric layer 47b may be disposed between the second gate electrode 49b and the second lower semiconductor region 8b, between the second gate electrode 49b and the first semiconductor channel layer 12a2, between the second gate electrode 49b and the second semiconductor channel layer 12b2, between the second gate electrode 49b and the third semiconductor channel layer 12c2, and between the second gate electrode 49b and the second source/drain regions 40b, and may cover side surfaces of the second gate electrode 49b. In an example, the third material layer 47b_1 of the second gate dielectric layer 47b may be disposed between the fourth material layer 47b_2 and the second lower semiconductor region 8b, between the fourth material layer Between 47b_2 and the first semiconductor channel layer 12a2, between the fourth material layer 47b_2 and the second semiconductor channel layer 12b2, and between the fourth material layer 47b_2 and the third semiconductor channel layers 12c2.

The second source/drain regions 40b may extend in the vertical direction Z on the second active region 8a to be in contact with side surfaces of the plurality of semiconductor channel layers 12a2, 12b2, and 12c2 in the first direction D1. For example, as illustrated in FIG. 2B, the second source/drain regions 40b may at least partially overlap lower parts of side surfaces of the second gate structure 45b.

According to example embodiments, a first transistor may be provided in the first transistor region TR1. The first transistor may include the first gate structure 45a, the first source/drain regions 40a, and the fin structure 33 between the first source/drain regions 40a. The fin structure 33 may be provided as a channel region of the first transistor.

The first gate dielectric layer 47a of the first gate structure 45a may not be in direct contact with the plurality of first semiconductor layers 10a, 10b, and 10c, which may be formed of silicon-germanium, and may be in direct contact with the semiconductor capping layer 27 which may be formed of silicon. As described above, the first gate dielectric layer 47a of the first gate structure 45a may be spaced apart from the plurality of first semiconductor layers 10a, 10b, and 10c and may be in direct contact with the semiconductor capping layer 27 to improve reliability of the first gate dielectric layer 47a, to prevent a threshold voltage of the first transistor from abnormally decreasing or becoming unstable, and to improve electrical characteristics of the first transistor.

According to example embodiments, a second transistor may be provided in the second transistor region TR2. The second transistor may include the second gate structure 45b, the second source/drain regions 40b, and the semiconductor channel layers 12a2, 12b2, and 12c2 between the second source/drain regions 40b. The second transistor may be a gate-all-around (GAA) MOSFET.

Figure 3:
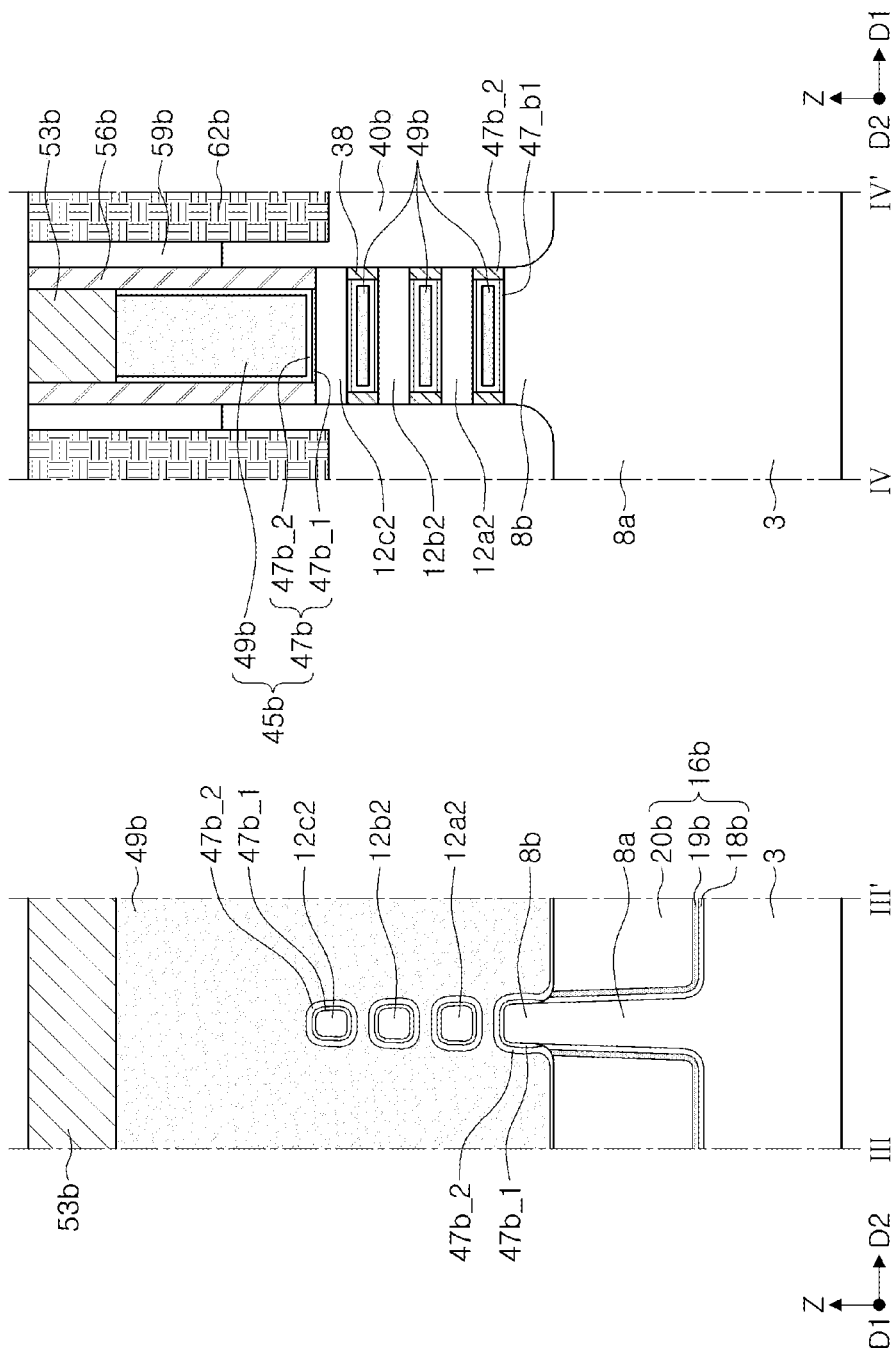
FIG. 3 illustrates a cross-sectional view of a modified example of a semiconductor device according to an example embodiment.

In an example, the second gate structure 45b may be in direct contact with the second source/drain regions 40b, but example embodiments are not limited thereto. For example, the second gate structure 45b may be spaced apart from the second source/drain regions 40b. Such a modified example, in which the second gate structure 45b and the second source/drain regions 40b are spaced apart from each other, will be described with reference to FIG. 3. FIG. 3 is a cross-sectional view, taken along lines and IV-IV' in FIG. 1, illustrating the modified example in which the second gate structure 45b and the second source/drain regions 40b are spaced apart from each other.

Referring to FIG. 3, insulating spacers 38 may be disposed between the second gate structure 45b and the second source/drain regions 40b. The second gate structure 45b and the second source/drain regions 40b may be spaced apart from each other by the insulating spacers 38.

Returning again to FIGS. 2A and 2B, each of the plurality of second semiconductor layers 12a1, 12b1, and 12c1 and the plurality of semiconductor channel layers 12a2, 12b2, and 12c2 may have the same thickness, but example embodiments may not be limited thereto. For example, in a modified example, one of the plurality of second semiconductor layers 12a1, 12b1, and 12c1 may have a thickness different from a thickness of each of the other second semiconductor layers, and one of the plurality of semiconductor channel layers 12a2, 12b2, and 12c2 may have a thickness different from a thickness of each of the other semiconductor channel layers. Such a modified example will be described with reference to FIGS. 4A and 4B and FIGS. 5A and 5B.

Figure 4A:
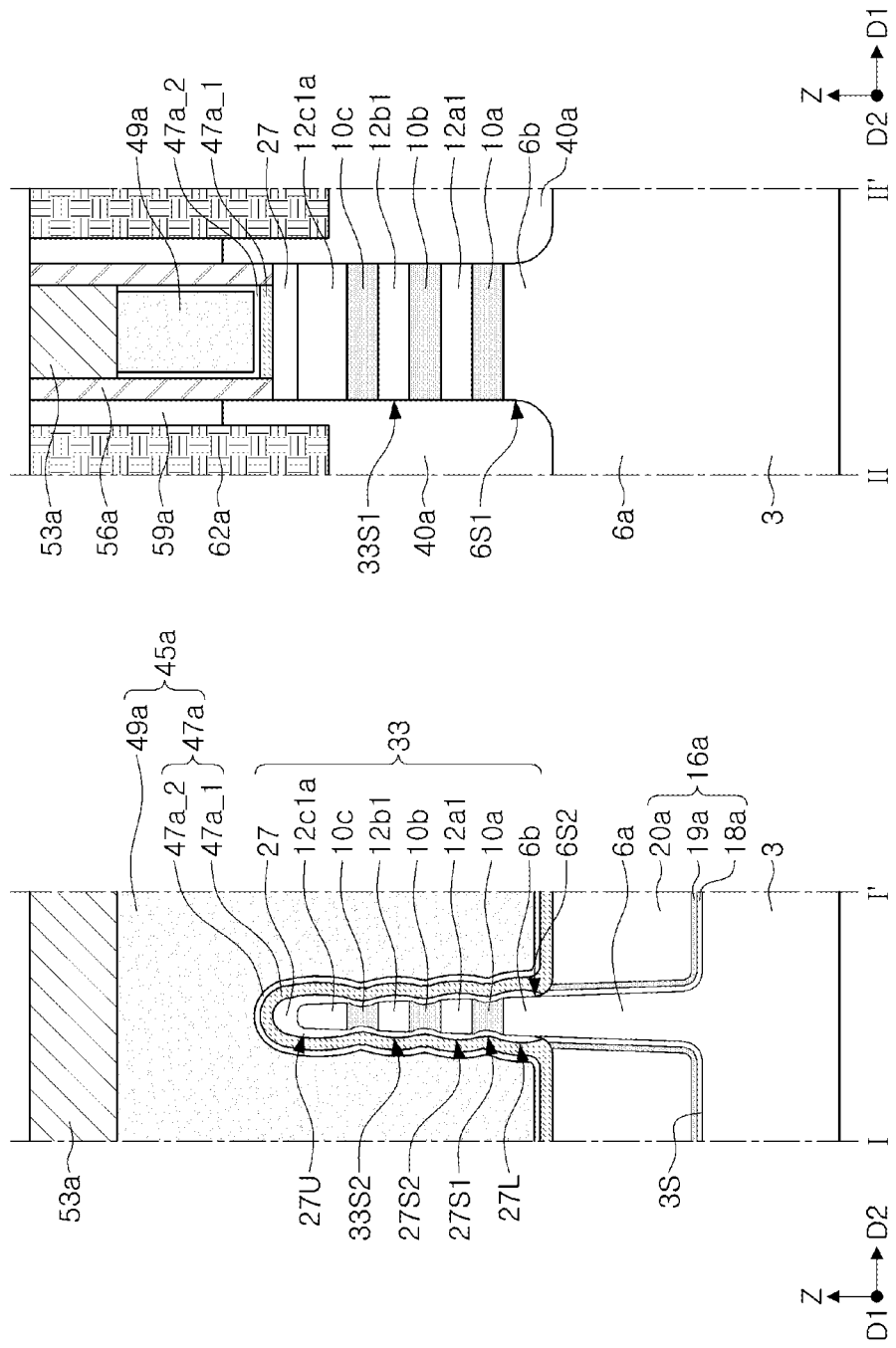
FIGS. 4A and 4B illustrate cross-sectional views of a modified example of a semiconductor device according to an example embodiment.
Figure 4B:
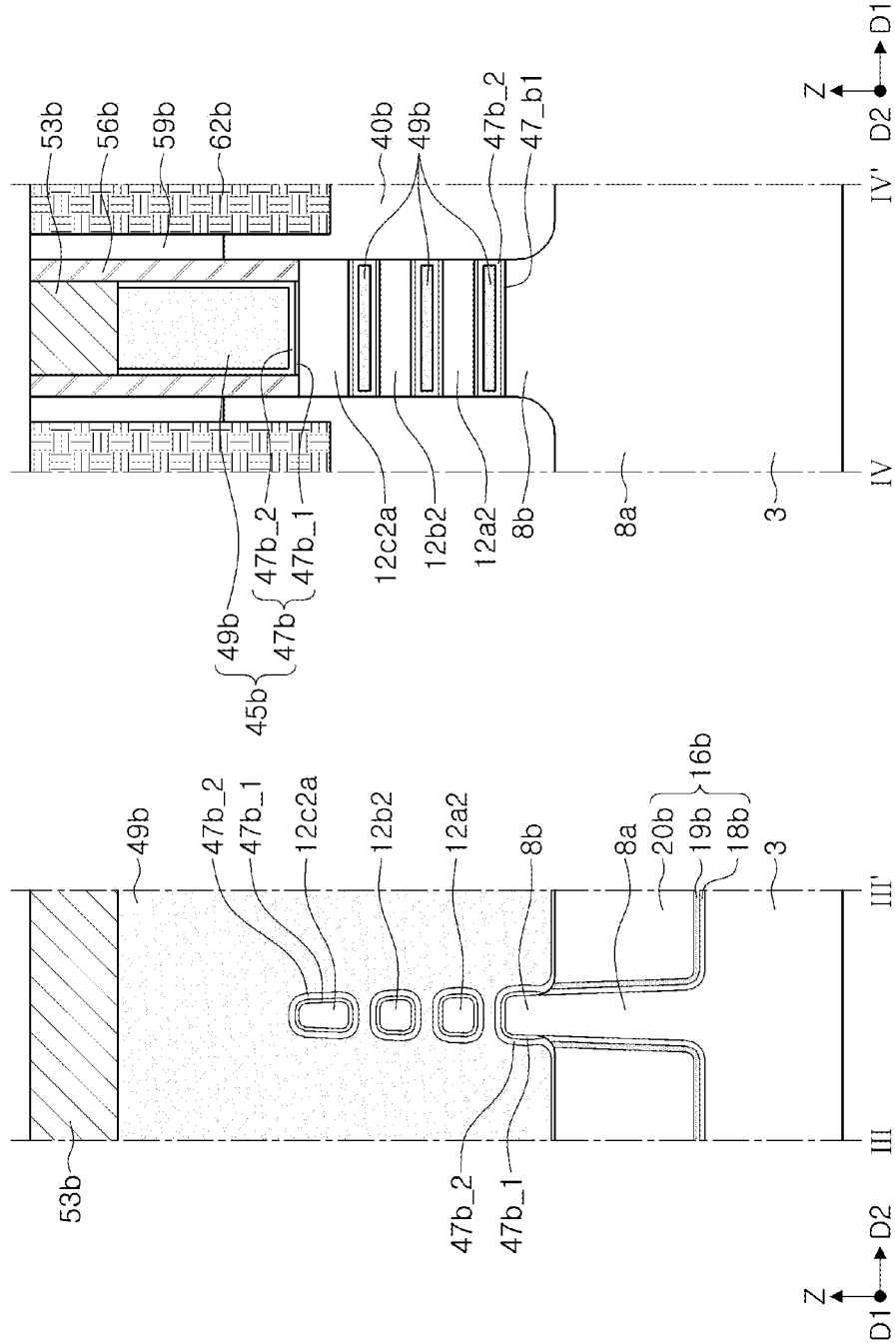

In a modified example, referring to FIGS. 4A and 4B, among a plurality of second semiconductor layers 12a1, 12b1, and 12c1a spaced apart from each other in a vertical direction Z, a second uppermost semiconductor layer 12c1a may have a thickness greater than a thickness of each of the other second semiconductor layers 12a1 and 12b1. Among the plurality of semiconductor channel layers 12a2, 12b2, and 12c2a spaced apart from each other in the vertical direction Z, an uppermost semiconductor channel layer 12c2a may have a thickness greater than a thickness of each of the other semiconductor channel layers 12a2 and 12b2.

Figure 5A:
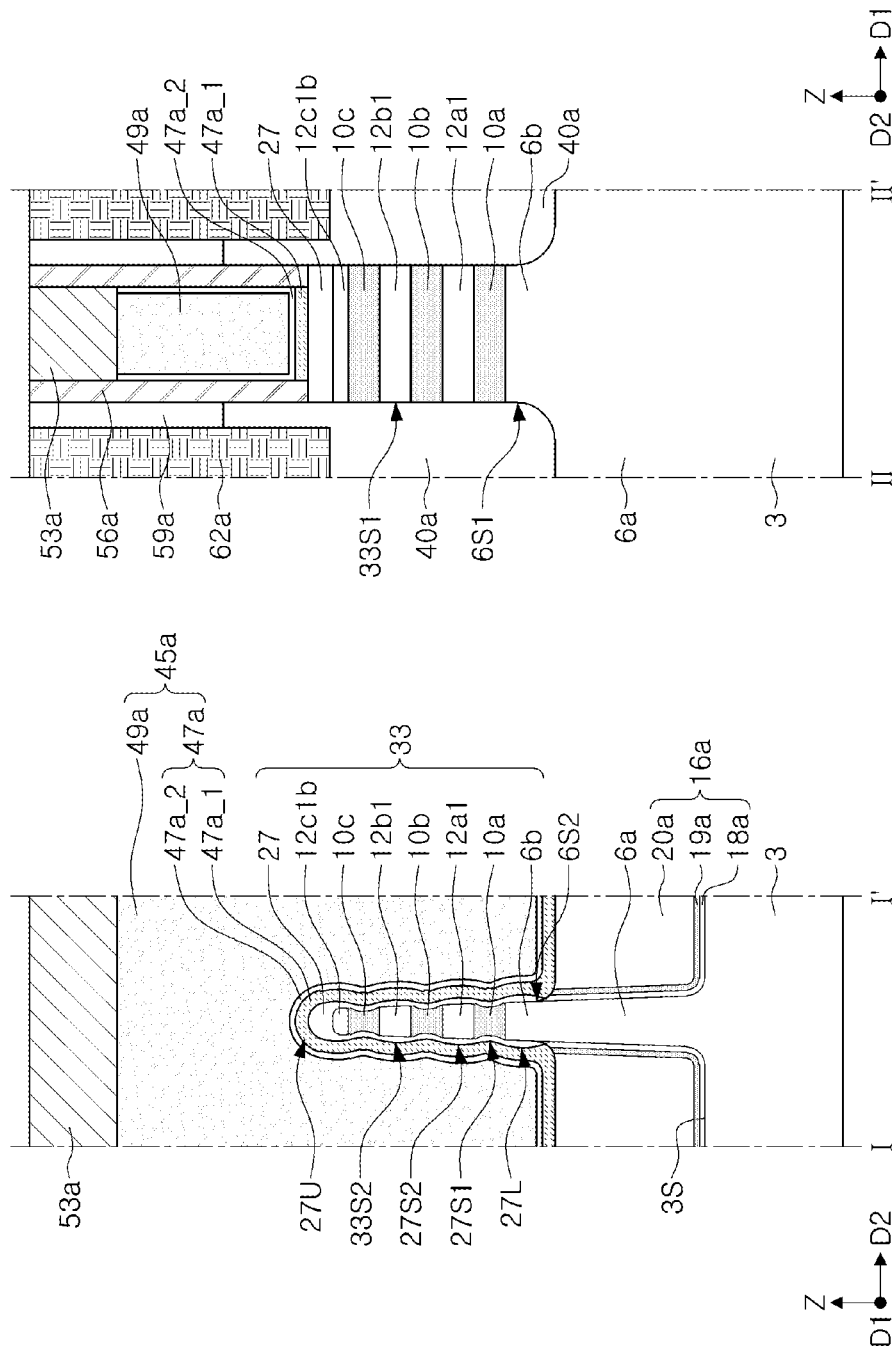
FIGS. 5A and 5B illustrate cross-sectional views of a modified example of a semiconductor device according to an example embodiment.
Figure 5B:
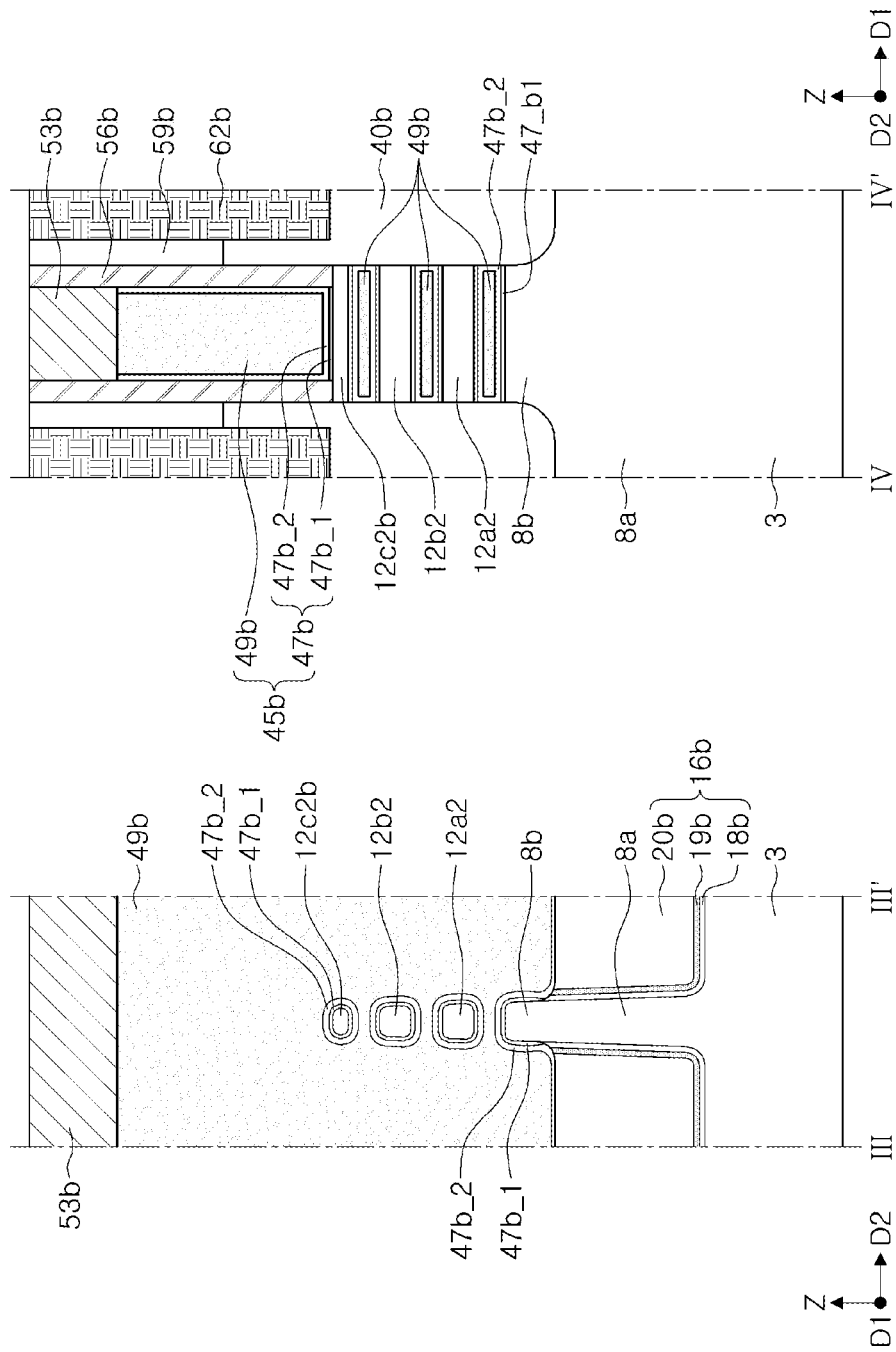

In another modified example, referring to FIGS. 5A and 5B, among the plurality of second semiconductor layers 12a1, 12b1, and 12c1b spaced apart from each other in the vertical direction Z, an uppermost second semiconductor layer 12c1b may have a thickness smaller than a thickness of each of the other second semiconductor layers 12a1 and 12b1. Among the plurality of semiconductor channel layers 12a2, 12b2, and 12c2b spaced apart from each other in the vertical direction Z, an uppermost semiconductor channel layer 12c2b may have a thickness less than a thickness of each of the other semiconductor channel layers 12a2 and 12b2.

Next, the above modified example of the semiconductor capping layer (27 in FIG. 2A) will be described with reference to FIG. 6.

Figure 6:
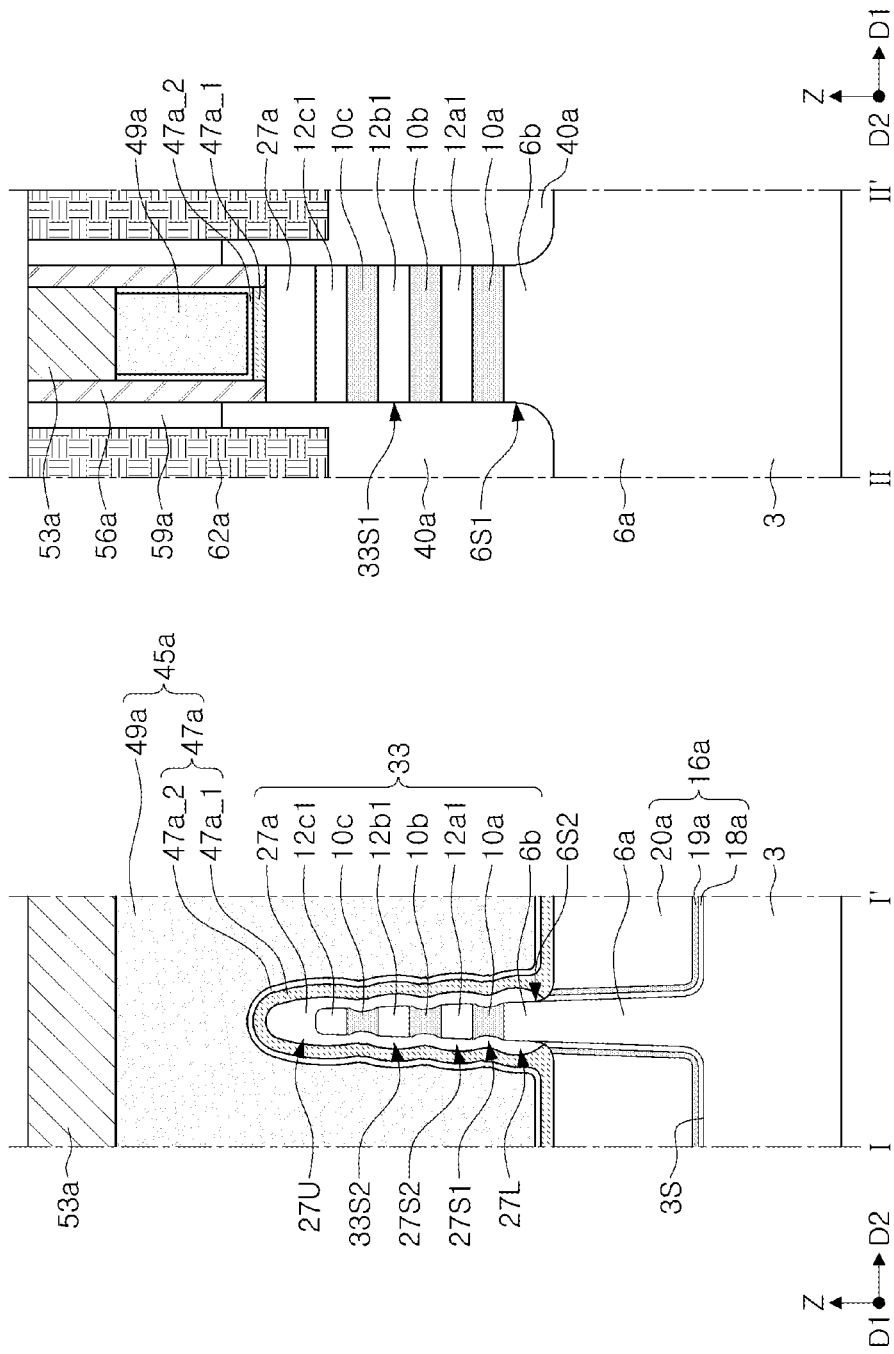
FIG. 6 illustrates a cross-sectional view of a modified example of a semiconductor device according to an example embodiment.

In the modified example, referring to FIG. 6, a semiconductor capping layer 27a having an increased thickness may be disposed. The semiconductor capping layer 27a may overlap an upper end of the first buffer insulating layer 18a and an upper end of the first insulating liner 19a in the vertical direction Z.

Next, the above modified example of the fin structure (33 in FIG. 2A) will be described with reference to FIG. 7.

Figure 7:
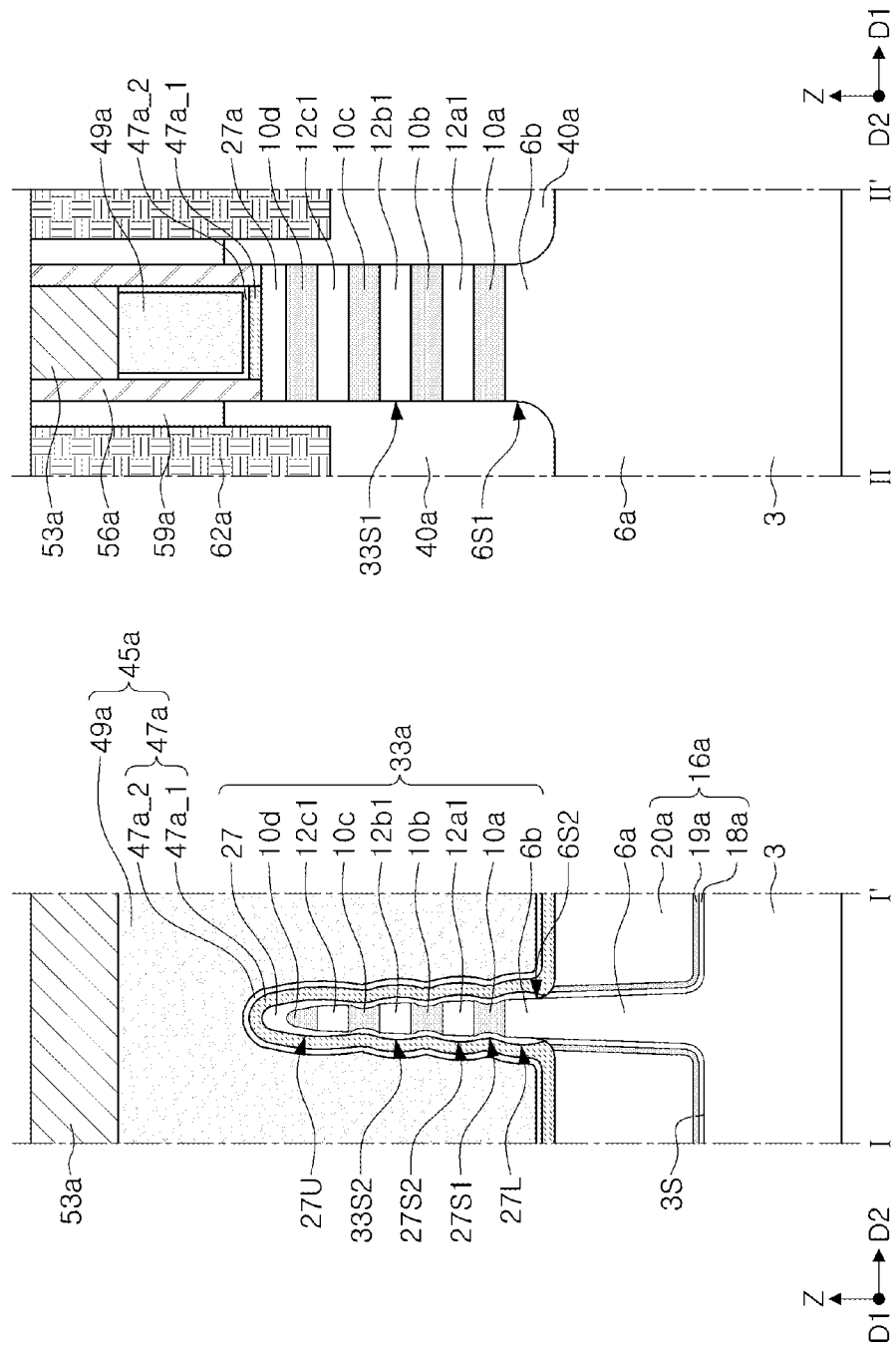
FIG. 7 illustrates a cross-sectional view of a modified example of a semiconductor device according to an example embodiment.

Referring to FIG. 7, the fin structure 33a may include a plurality of first semiconductor layers 10a, 10b, 10c, and 10d, and a plurality of second semiconductors, alternately stacked on the first lower semiconductor region 6b. Among the plurality of first semiconductor layers 10a, 10b, 10c, and 10d, and the plurality of second semiconductors, alternately stacked, a lowermost layer may be a lowermost first semiconductor layer 10a and an uppermost layer may be an uppermost first semiconductor layer 10d.

Figure 8:
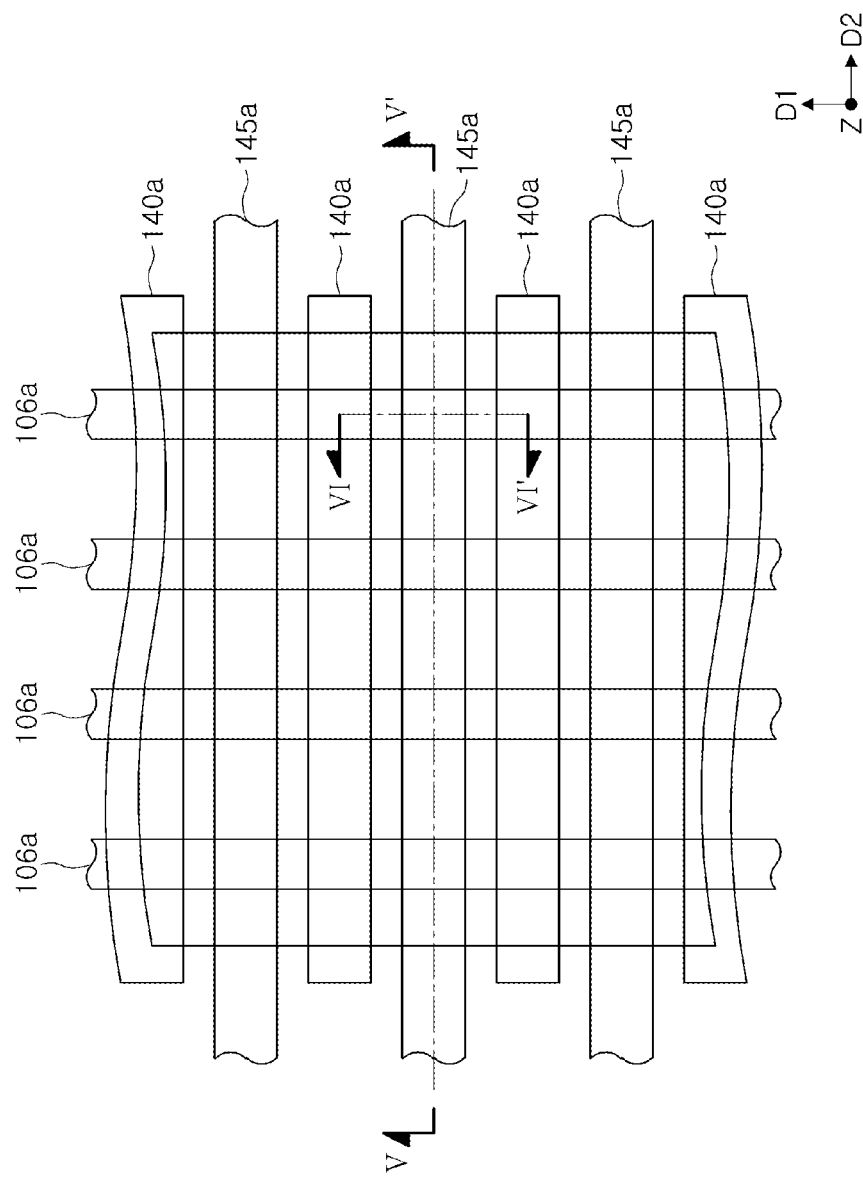
FIG. 8 illustrates a plan view of a modified example of a semiconductor device according to an example embodiment.

Next, the above modified example of the first active region (6a in FIGS. 1 and 2A), the first gate electrode (45a in FIGS. 1 and 2A), the source/drain regions (40a in FIGS. 1 and 2A), and the first isolation layer (16a in FIGS. 1 and 2A) will be described with reference to FIGS. 8 and 9. FIG. 8 is a plan view illustrating a modified example of the semiconductor device according to an example embodiment, and FIG. 9 is a cross-sectional view taken along lines V-V and VI-VI' in FIG. 8.

Figure 9:
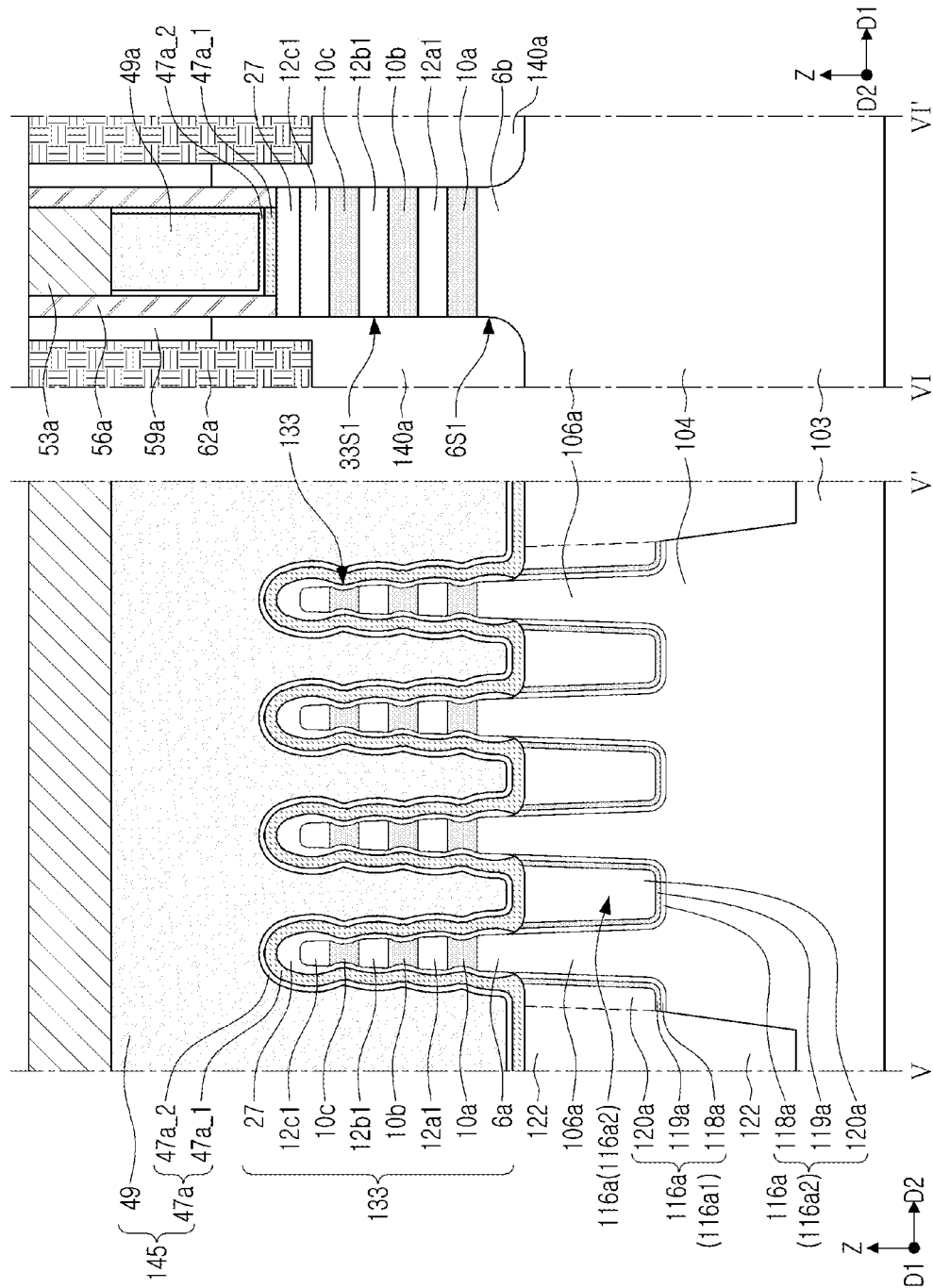
FIG. 9 illustrates a cross-sectional view of a modified example of a semiconductor device according to an example embodiment.

Referring to FIGS. 8 and 9, a base active region 104 protruding from a semiconductor substrate 103, a plurality of first active regions 106a extending from the base active region 104 in the vertical direction Z, and fin structures 133 extending from the first active regions 106a in the vertical direction Z, respectively, may be disposed. The first active regions 106a may extend in the first direction D1.

Shallow isolation layers 116a may be disposed on the base active region 104 to define the plurality of first active regions 106a. Deep isolation layers 122 may be disposed to define the base active region 104 and surround external sides of the shallow isolation layers 116a.

The shallow isolation layers 116a may include a first shallow isolation portion 116a1 and a second shallow isolation portion 116a2. The first shallow isolation portion 116a1 may be in contact with the deep isolation layer 122 in the second direction D2. The second shallow isolation portion 116a2 may be interposed between the first active regions 106a.

Each of the shallow isolation layers 116a may include a buffer insulating layer 118a covering a surface of the base active region 104 and extending upwardly of side surfaces of each of the first active regions 106a, an insulating liner 119a covering the buffer insulating layer 118a, and a gap-fill insulating layer 120a covering the insulating liner 119a.

The fin structures 133 may be disposed on the first active regions 106a. Each of the fin structures 133 may extend from each of the first active regions 106a in the vertical direction Z.

Each of the fin structures 133 may be formed of substantially the same material as the above-described fin structure (33 in FIG. 2A) and may be formed to have substantially the same structure as the above-described fin structure (33 in FIG. 2A). Accordingly, each of the fin structures 133 may include the first lower semiconductor region 6b, the plurality of first semiconductor layers 10a, 10b, and 10c, and the plurality of second semiconductor layers 12a1, 12b1, and 12c1, and the semiconductor capping layer 27, described above with reference to FIG. 2A.

A plurality of gate structure 145 may be disposed parallel to each other, and may overlap the fin structures 133 and extend in the second direction D2. Each of the plurality of gate structures 145 may be formed of substantially the same material as the above-described first gate structure (45a in FIG. 2A) and may be formed to have substantially the same structure as the above-described first gate structure (45a in FIG. 2A). Accordingly, since the structure and material of the plurality of gate structures 145 can be understood from the first gate structure (45a in FIG. 2A), detailed description thereof will be omitted.

Source/drain regions 140a may be formed to be in contact with side surfaces 33S1 of each of the fin structures 133 in the first direction D1, on the first active regions 106a.

Similarly as described above in FIG. 2A, a gate capping layer 53a may be disposed on each of the plurality of gate structures 145, a gate spacer 56a may be disposed on side surfaces of each of the plurality of gate structures 145 and side surfaces of the gate capping layer 43a, a contact plug 62a may be disposed on the source/drain regions 140a, and an insulating layer 59a may be disposed between the contact plug 62a and the gate spacer 56a.

Figure 10:
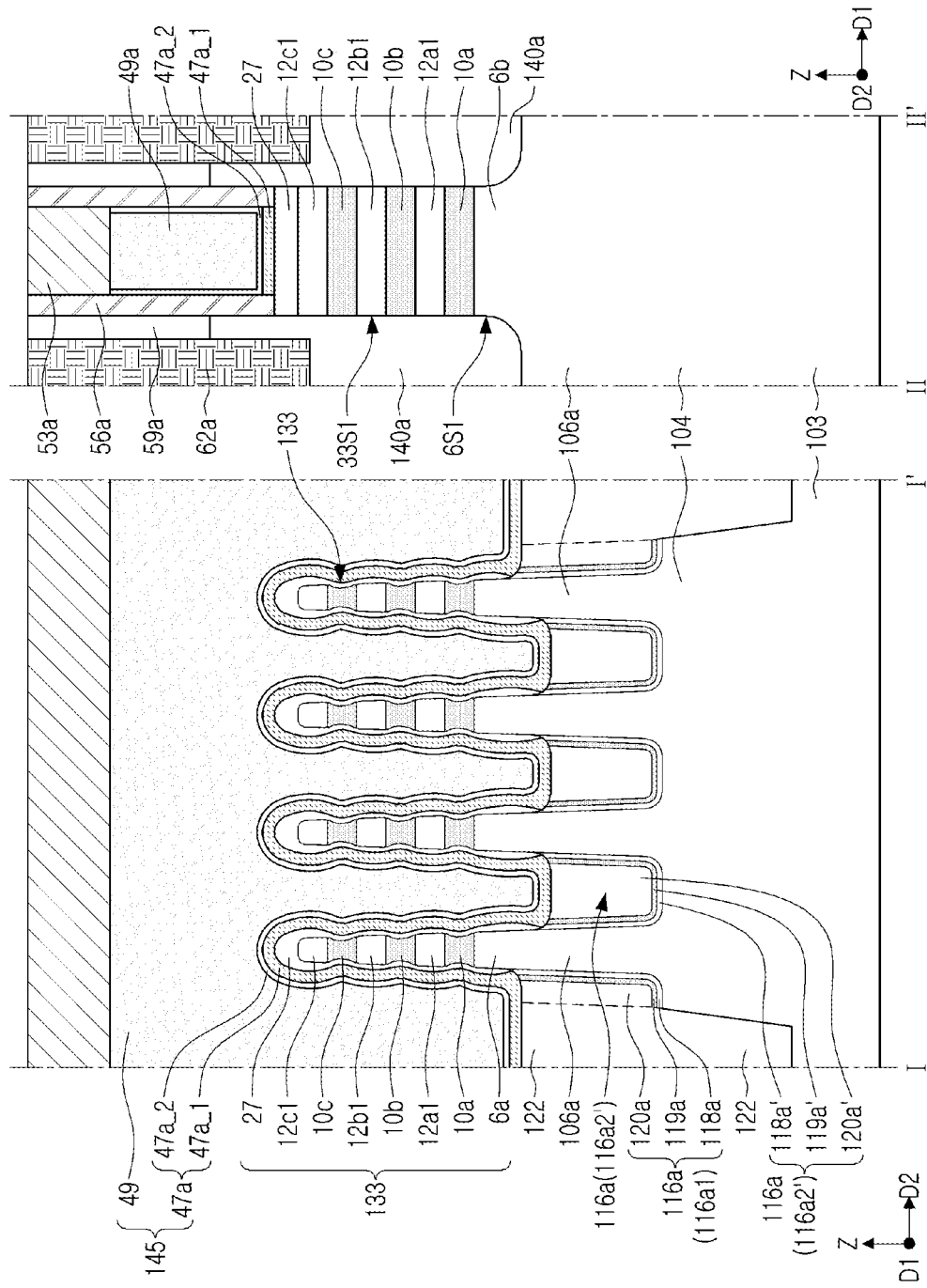
FIG. 10 illustrates a cross-sectional view of a modified example of a semiconductor device according to an example embodiment.

The first shallow isolation portion 116a1 and the second shallow isolation portion 116a2 may have upper surfaces disposed at substantially the same level, but example embodiments are not limited thereto. For example, the upper surface of the second shallow isolation portion 116a2 may be modified to be disposed on a level different from a level of the upper surface of the first shallow isolation portion 116a1. Such a modified example will be described with reference to FIG. 10. FIG. 10 is a cross-sectional view along lines V-V and VI-VI' in FIG. 8.

In the modified example, referring to FIG. 10, the shallow isolation layers 116a, described above in FIG. 9, may include a first shallow isolation portion 116a1 and a second shallow isolation portion 116a2' having an upper surface disposed at a level lower than a level of an upper surface of the first shallow isolation portion 116a1. Since the upper surface of the second shallow isolation portion 116a' is disposed lower than the upper surface of the first shallow isolation portion 116a1, lower ends of the fin structures 133, disposed to be in contact with the second shallow isolation portion 116a2, may be lower than lower ends of the fin structures 133, disposed to be in contact with the first shallow isolation portion 116a1.

Figure 11:
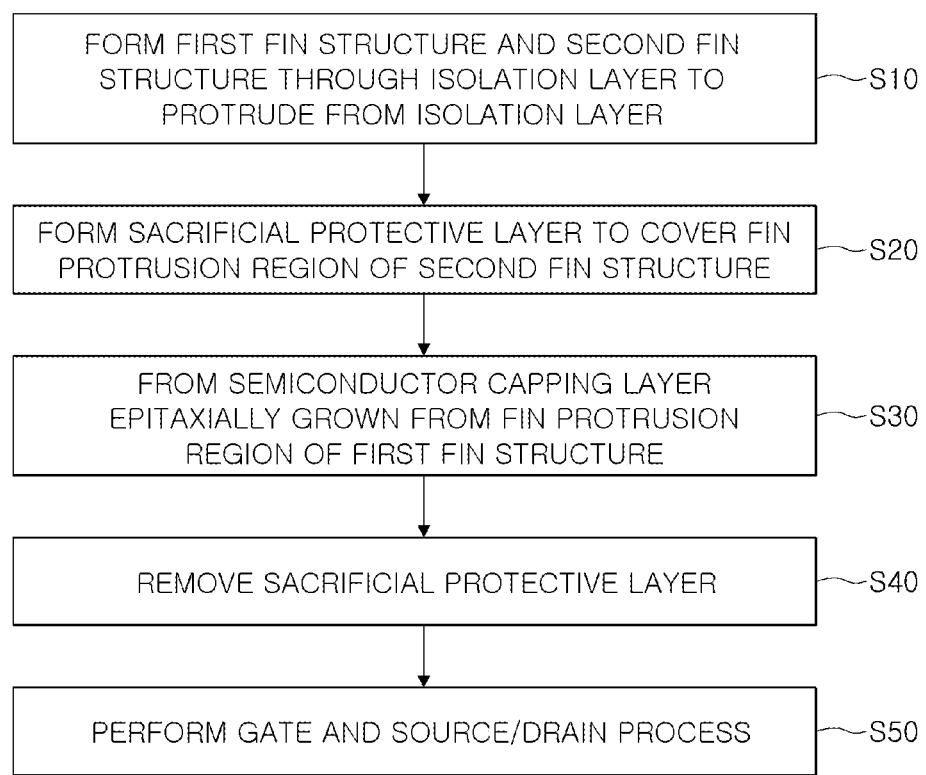
FIG. 11 illustrates a process flowchart of a method of forming a semiconductor device according to example embodiments.

Next, an example of a method of forming a semiconductor device according to example embodiments will be described with reference to FIGS. 1, 11, and 12A to 14B. FIG. 11 is a process flowchart illustrating a method of forming a semiconductor device in accordance with example embodiments, and FIGS. 12A to 14B are cross-sectional views illustrating stages in a method of forming a semiconductor device according to example embodiments. In FIGS. 12A to 14B, FIGS. 12A, 13A, and 14A are cross-sectional views taken along lines I-I' and in FIG. 1, and FIGS. 12B, 13B, and 14B are cross-sectional views taken along lines II-II' and IV-IV' in FIG.

Referring to FIGS. 1, 11, 12A and 12B, the first fin structure and the second fin structure may be formed through the isolation layers 16a and 16b to protrude from the isolation layers 16a and 16b (S10). Forming the first fin structure and the second fin structure through the isolation layers 16a and 16b to protrude from the isolation layers 16a and 16b may include performing an epitaxial growth process on the semiconductor substrate 3 to form a plurality of silicon-germanium layers 10 and a plurality of silicon layers 12, alternately stacked, etching the plurality of silicon-germanium layers 10, the plurality of silicon layers 12, and the semiconductor substrate 3 to form the first fin structure and the second fin structure, and form the isolation layers 16a and 16b to cover lower side surfaces of the first fin structure and the second fin structure, disposed below the plurality of silicon-germanium layers 10 and the plurality of silicon layers 12, on the semiconductor substrate 3.

Forming the isolation layers 16a and 16b may include oxidizing a surface of the semiconductor substrate 3 and surfaces of the first fin structure and the second fin structure to form buffer insulating layers 18a and 18b after etching the plurality of silicon-germanium layers 10, the plurality of silicon layers 12, and the semiconductor substrate 3 to form the first fin structure and the second fin structure, forming insulating liners 19a and 19b to conformally cover the buffer insulating layers 18a and 18b, forming gap-fill insulating layers 20a and 20b on the insulating liners 19a and 19b, and etching the gap-fill insulating layers 20a and 20b, the insulating liners 19a and 19b, and the buffer insulating layers 18a and 18b to expose upper regions of the first fin structure and the second fin structure.

The side surfaces of the plurality of silicon-germanium layers 10 may be concavely recessed further than the side surfaces of the plurality of silicon layers 12 while forming the isolation layers 16a and 16b. For example, the side surfaces of the plurality of silicon-germanium layers 10 may be concavely recessed further than the side surfaces of the plurality of silicon layers 12 while thermally oxidizing the plurality of silicon-germanium layers 10 and the plurality of silicon layers 12 to form the buffer insulating layers 18a and 18b.

The first fin structure may be formed in the first transistor region (TR1 in FIG. 1), and the second fin structure may be formed in the second transistor region (TR2 in FIG. 1). The isolation layer, disposed in the first transistor region TR1 in FIG. 1, may be defined as a first isolation layer 16a and the isolation layer, disposed in the second transistor region (TR2 in FIG. 1), may be defined as a second isolation layer 16b.

The first fin structure, formed in the first transistor region (TR1 in FIG. 1), may include the first active region 6a having a side surface surrounded by the first isolation layer 16a, the first lower semiconductor region 6b disposed at a level higher than a level of the isolation layer 16a, and the plurality of silicon-germanium layers 10 and the plurality of silicon layers 12 formed on the first lower semiconductor region 6b. The first active region 6a and the first lower semiconductor region 6b may be formed while etching the semiconductor substrate 3.

The second fin structure, formed in the second transistor region (TR2 in FIG. 1), may include the second active region 8a having a side surface surrounded by the second isolation layer 16b, a second lower semiconductor region 8b disposed at a level higher than a level of the second isolation layer 16b, and the plurality of silicon-germanium layers 10 and the plurality of silicon layers 12 formed on the second lower semiconductor region 8b. The second active region 8a and the second lower semiconductor region 8b may be formed while etching the semiconductor substrate 3.

In the first fin structure, a portion protruding from the first isolation layer 16a may be defined as a first fin protrusion region 6P. In the second fin structure, a portion protruding from the second isolation layer 16b may be defined as a second fin protrusion region 8P.

A sacrificial protective layer may be formed to cover first and second fin protrusion regions 6P and 8P of the first and second fin structures. For example, a first sacrificial protective layer 24a, a second sacrificial protective layer 24b, and a third sacrificial protective layer 24c may be sequentially formed to cover surfaces of the first and second fin protrusion regions 6P and 8P and the first and second isolation layers 16a and 16b. The first sacrificial protective layer 24a and the second sacrificial protective layer 24b may be formed of, e.g., silicon oxide, and the third sacrificial protective layer 24c may be formed of, e.g., silicon nitride.

Figure 13A:
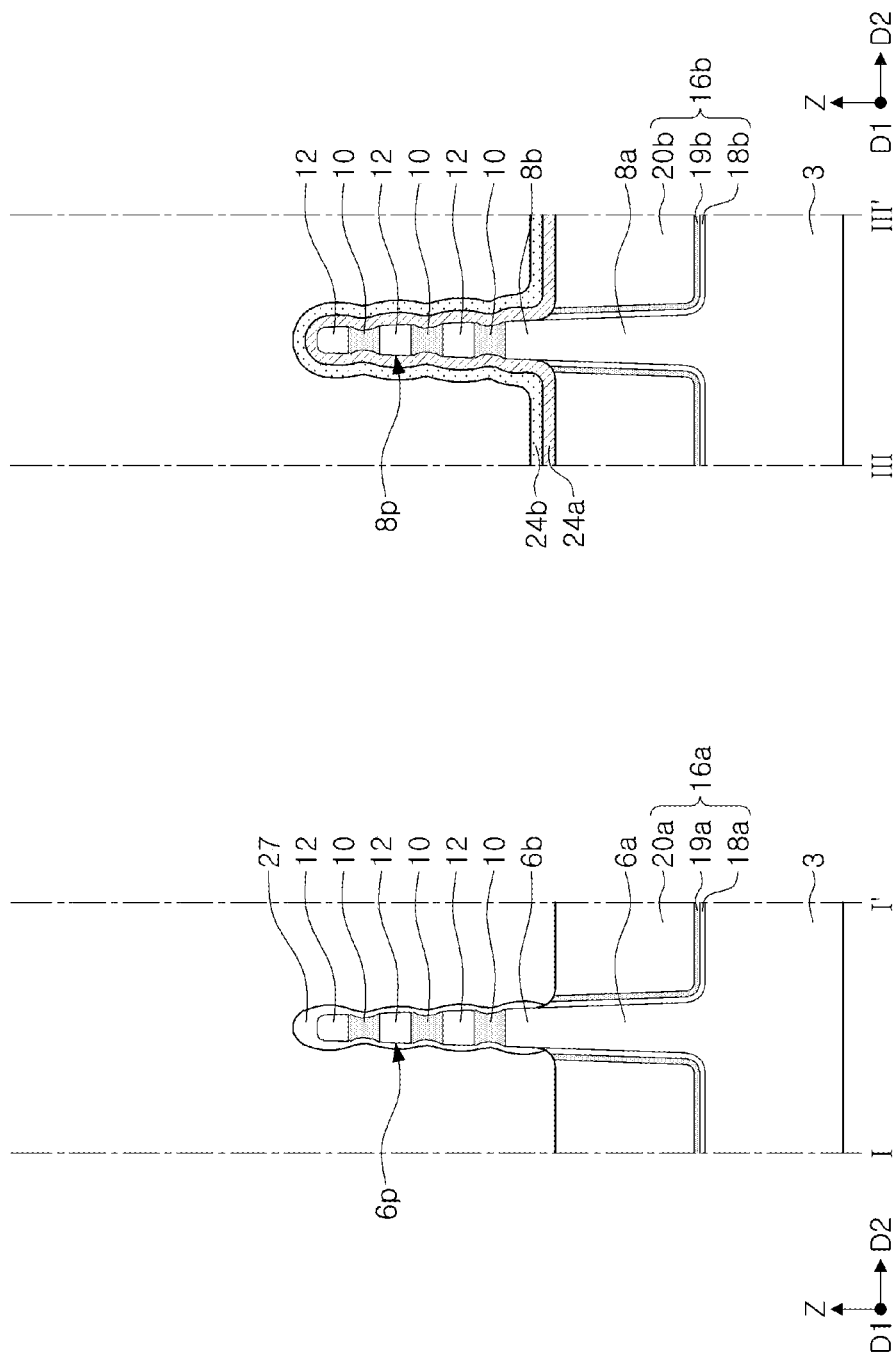
Figure 13B:
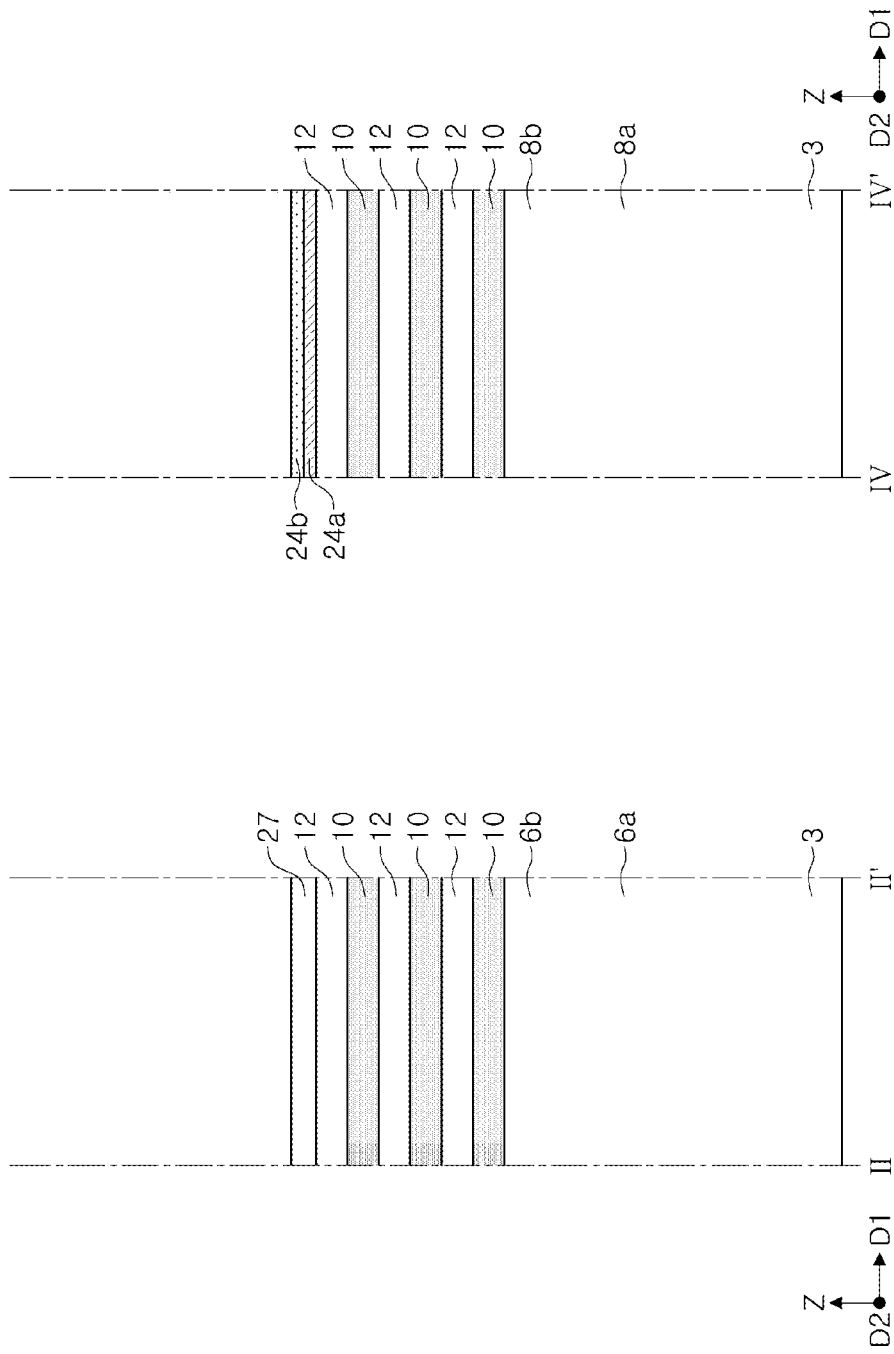

Referring to FIGS. 11, 13A, and 13B, A sacrificial protective layer may be formed to cover the second fin protrusion region 8P of the second fin structure (S20). For example, the first sacrificial protective layer 24a, the second sacrificial protective layer 24b, and the third sacrificial protective layer 24c on the first isolation layer 16a and the first fin protrusion region 6P may be removed. Then, among the first sacrificial protective layer 24a, the second sacrificial protective layer 24b, and the third sacrificial protective layer 24c remaining on the second isolation layer 16b and the second fin protrusion region 8P, the third sacrificial protective layer 24c may be removed. Accordingly, the first and second sacrificial protective layers 24a and 24b may be formed to cover the second fin protrusion region 8P of the second fin structure. A semiconductor capping layer 27, epitaxially grown from the first fin protrusion region 6P of the first fin structure, may be formed (S30).

Figure 14A:
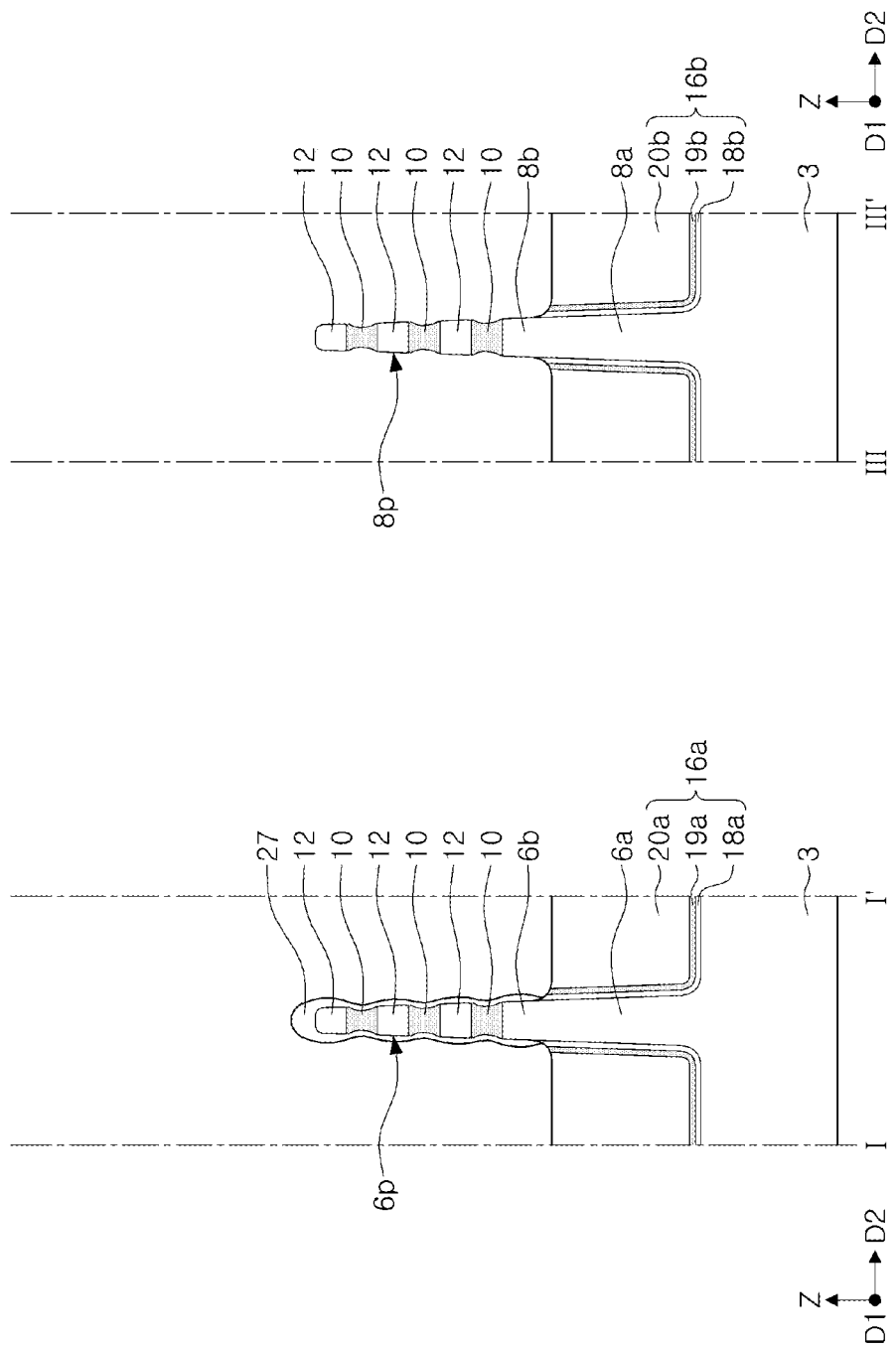
Figure 14B:
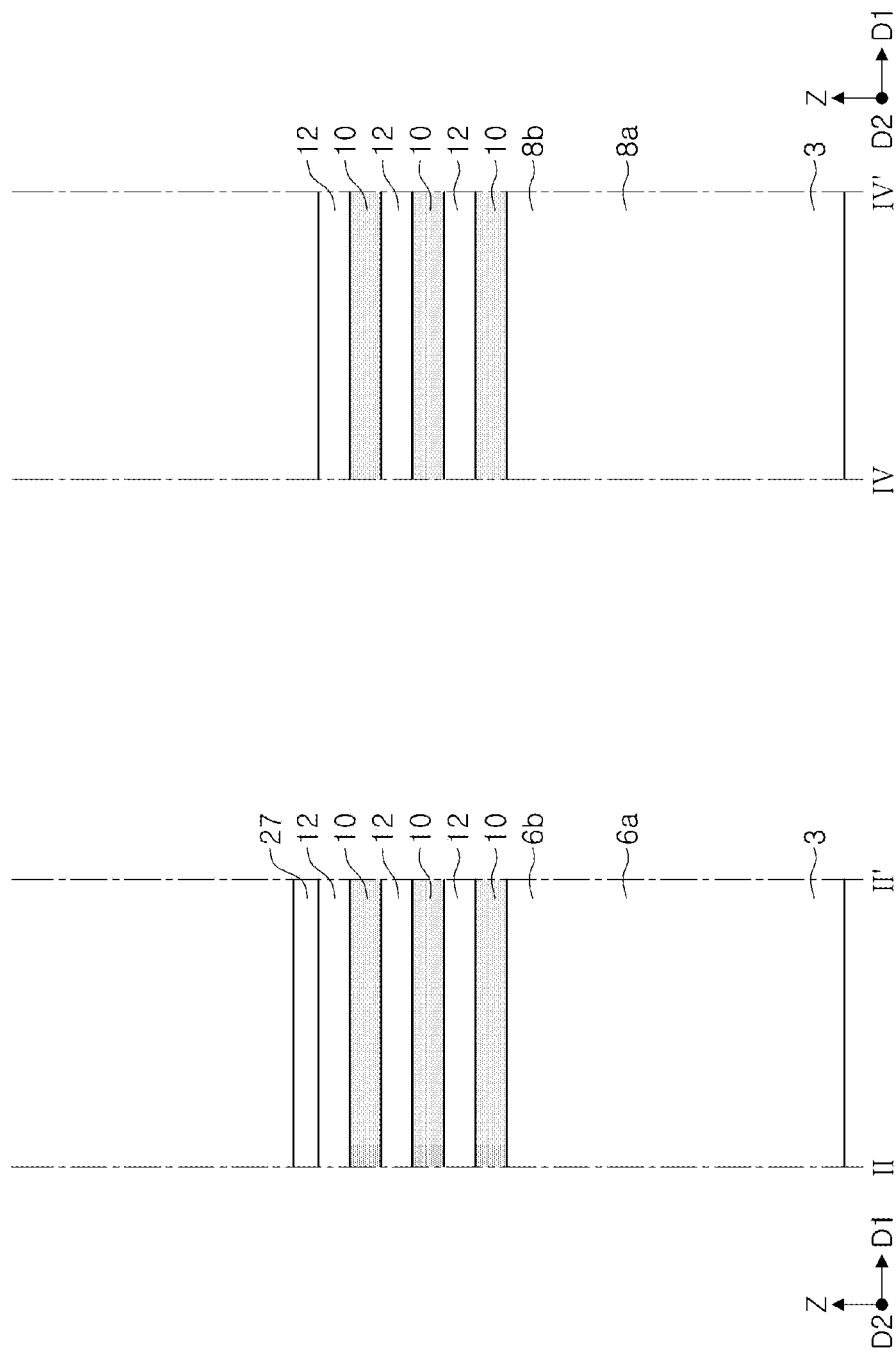

Referring to FIGS. 11, 14A, and 14B, the sacrificial protective layer may be removed (S40). Removing the sacrificial protective layer may include removing the first sacrificial protective layer 24a and the second sacrificial protective layer 24b remaining on the second isolation layer 16b and the second fin protrusion region 8P.

Accordingly, the first fin protrusion region 6P and the semiconductor capping layer 27 may be formed in the first transistor region TR1, and the second fin protrusion region 8P, not covered with the semiconductor capping layer 27, may be formed in the second transistor region TR2. The first fin protrusion region 6P and the semiconductor capping layer 27 may be used to form the fin structure (33 in FIG. 2A) described with reference to FIG. 2A.

Hereinafter, a modified example of the method of forming a semiconductor device according to example embodiments will be described with reference to FIGS. 15A and 15B.

Figure 12A:
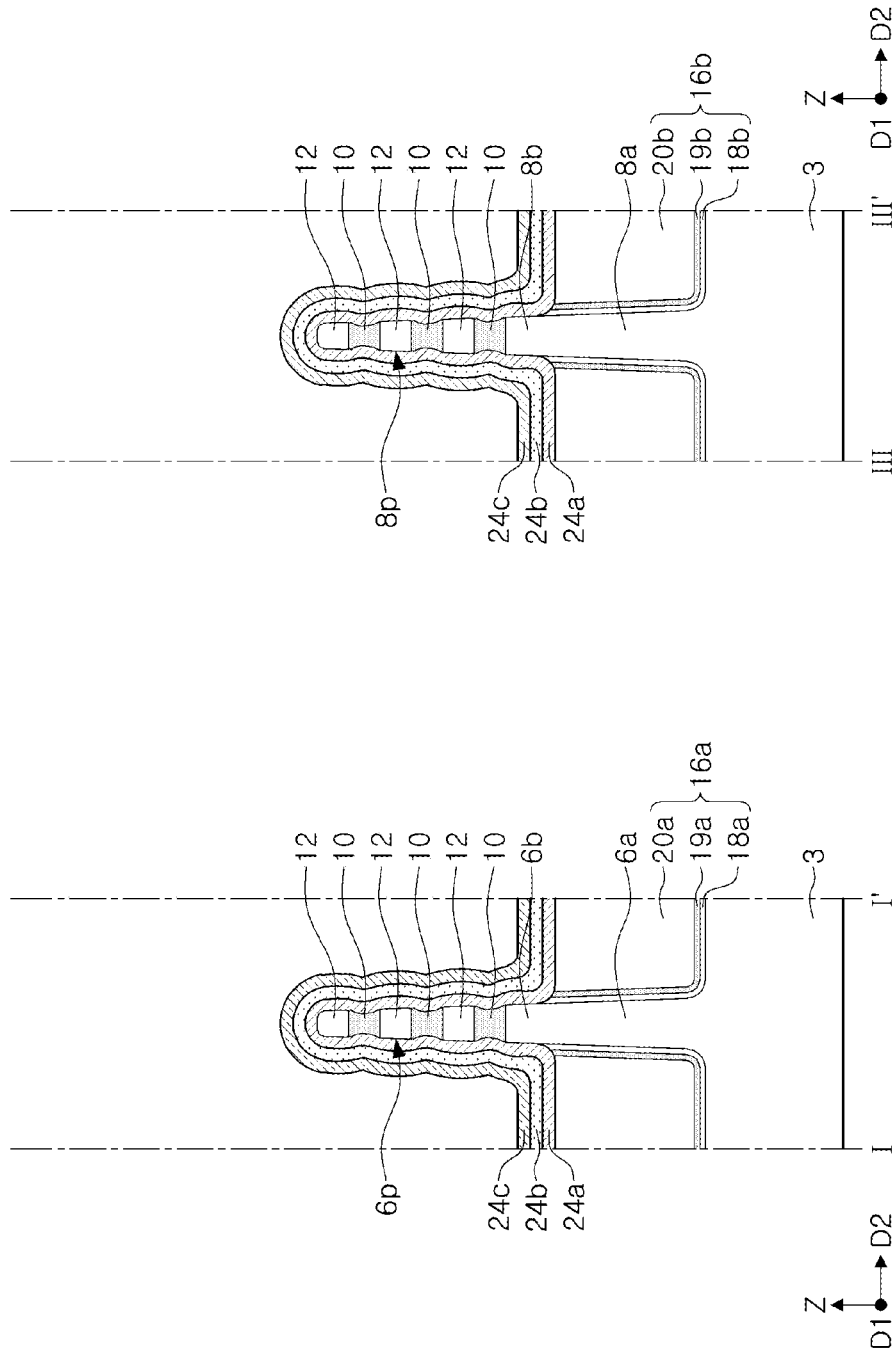
FIGS. 12A to 14B illustrate cross-sectional views of stages in a method of forming a semiconductor device according to example embodiments.
Figure 12B:
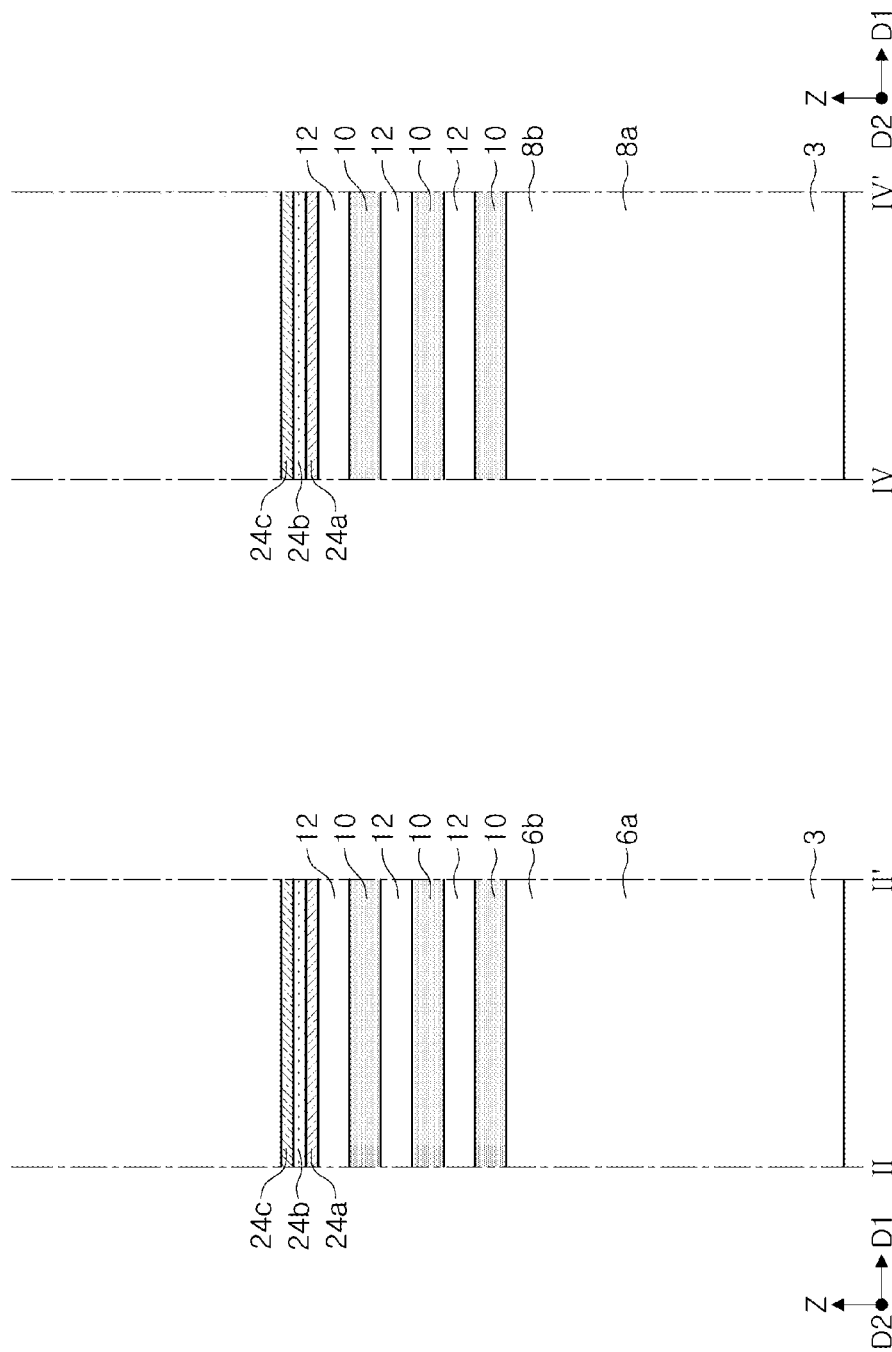

In a modified example, referring to FIGS. 15A and 15B, the same first and second fin structures as described in FIGS. 12A and 12B may be formed. Similarly, as described in FIGS. 12A and 12B, the first fin structure may have a first fin protrusion region 6P protruding from the first isolation layer 16a, and the second fin structure may have the second fin protrusion region 8P protruding from the second isolation layer 16b.

A sacrificial protective layer 24 may be formed to cover the second fin protrusion region 8P of the second fin structure. A semiconductor capping layer 27, epitaxially grown from a surface of the first fin protrusion region 6P, may be formed while protecting the second fin protrusion region 8P of the second fin structure from an epitaxial growth process with the second sacrificial protective layer 24b. Then, the sacrificial protective layer 24 may be selectively removed. Thus, the same structure as described in FIG. 14A may be formed.

Referring to FIGS. 1, 2A, 2B, and 11, a gate and source/drain process may be performed (S50). The gate and source/drain process may be performed to form the first and second gate structures 45a and 45b and the first and second source/drain regions 40a and 40b, as described in FIGS. 2A and 2B.

Forming the first gate structure 45a and the source/drain regions 40a may include forming the first material layer 47a_1 and a first sacrificial gate structure, sequentially stacked, across the first fin protrusion region (6P in FIGS. 14A and 14B) and the semiconductor capping layer (27 in FIGS. 14A and 14B), forming a first gate spacer 56a on a side surface of the first sacrificial gate structure, etching the first fin protrusion region (6P in FIGS. 14A and 14B) and the semiconductor capping layer (27 in FIGS. 14A and 14B) on opposite sides adjacent to the first sacrificial gate structure to form a fin structure 33 as described in FIG. 2A, forming the first source/drain regions 40a on opposite sides adjacent to the fin structure 33, removing the first sacrificial gate structure to form a first gate trench, sequentially forming a second material layer 47a2 and a first gate electrode 49a in the first gate trench as described in FIG. 2A, and forming a gate capping layer 53a on the first gate electrode 49a as described in FIG. 2A. Then, first contact plugs 62a may be formed to penetrate through the first insulating layer 59a.

Forming the second gate structure 45b and the second source/drain regions 40b may include forming a first material layer and a second sacrificial gate structure, sequentially stacked, across the second fin protrusion region (8P in FIGS. 14A and 14B), forming a second gate spacer 56b on a side surface of the second sacrificial gate structure, etching the second fin protrusion region (8P in FIGS. 14A and 14B) on opposite sides adjacent to the second sacrificial gate structure such that recesses are formed to expose the plurality of silicon-germanium layers (10 in FIGS. 14A and 14B) and the plurality of silicon layers (12 in FIGS. 14A and 14B) of the second fin protrusion region (8P in FIGS. 14A and 14B), forming second source/drain regions 40b to fill the recesses, forming the second source/drain regions 40b, forming a second insulating layer 59b on the second source/drain regions 40b, removing the first material layer and the second sacrificial gate structure such that a second gate trench is formed to expose side surfaces of the plurality of silicon-germanium layers (10 in FIGS. 14A and 14B) of the second fin protrusion region (8P in FIGS. 14A and 14B), selectively removing the plurality of silicon-germanium layers (10 in FIGS. 14A and 14B) of the second fin protrusion region (8P in FIGS. 14A and 14B) exposed by the second gate trench, sequentially forming a third material layer 41b_1, a fourth material layer 47b_2, and a second gate electrode 49b, as described in FIG. 2B, in the gate trench and a space in which the plurality of silicon-germanium layers (10 in FIGS. 14A and 14B), and forming a gate capping layer 53b, as described in FIG. 2B, on the second gate electrode 49b. Then, second contact plugs 62b may be formed to penetrate through the second insulating layer 53b.

By way of summation and review, example embodiments provide a semiconductor device, capable of improving electrical characteristics. That is, as described above, according to example embodiments, a semiconductor device having a channel structure having improved electrical characteristics may be provided.

In other words, according to example embodiments, a semiconductor device may include an epitaxially grown, e.g., silicon, semiconductor capping layer on a surface of a fin structure that includes alternating, e.g., Si/SiGe, semiconductor layers, so the semiconductor capping layer separates the alternating semiconductor layers from a gate electrode thereon. As such, the alternating semiconductor layers provide a channel of a high-voltage transistor, while the semiconductor capping layer is between the alternating semiconductor layers and a gate dielectric substance of a high-voltage transistor. Thus, the semiconductor capping layer prevents direct contact between the gate dielectric substance of the high-voltage transistor and the alternating semiconductor layers.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
active regions on a substrate;
a first isolation region on side surfaces of the active regions and on the substrate;
source/drain regions on the active regions;
fin structures on the active regions, the source/drain regions being in contact with first side surfaces of the fin structures in a first direction; and
a gate structure on the fin structures and the first isolation region,
wherein the gate structure covers second side surfaces of the fin structures in a second direction and upper surfaces of the fin structures, the second direction being perpendicular to the first direction, and the first direction and the second direction being parallel to an upper surface of the substrate,
wherein each of the fin structures includes:
a stack structure having first semiconductor layers and second semiconductor layers that alternate and are stacked in a vertical direction, the vertical direction being perpendicular to the upper surface of the substrate, and
a semiconductor capping layer that covers side surfaces of the stack structure in the second direction,
wherein the first semiconductor layers include a material different from a material of the second semiconductor layers, and
wherein a width in the second direction of a central portion of at least one of the second semiconductor layers is greater than a width in the second direction of a central portion of at least one of the first semiconductor layers.

2. The semiconductor device as claimed in claim 1, wherein:
the first semiconductor layers include:
a first lower semiconductor layer;
a first intermediate semiconductor layer on the first lower semiconductor layer; and
a first upper semiconductor layer on the first intermediate semiconductor layer, and
wherein the second semiconductor layers include:
a second lower semiconductor layer between the first lower semiconductor layer and the first intermediate semiconductor layer;
a second intermediate semiconductor layer between the first intet mediate semiconductor layer and the first upper semiconductor layer; and
a second upper semiconductor layer on the first upper semiconductor layer.

3. The semiconductor device as claimed in claim 2, wherein a width in the second direction of a central portion of the first lower semiconductor layer is greater than a width in the second direction of a central portion of the first upper semiconductor layer.

4. The semiconductor device as claimed in claim 2, wherein a width in the second direction of a central portion of the second intermediate semiconductor layer is greater than a width in the second direction of a central portion of the first upper semiconductor layer.

5. The semiconductor device as claimed in claim 2, wherein a width in the second direction of a central portion of the second intermediate semiconductor layer is greater than a width in the second direction of a central portion of the first intermediate semiconductor layer.

6. The semiconductor device as claimed in claim 2, wherein a thickness of
a first portion of the semiconductor capping layer contacting a central portion of one of the first semiconductor layers is different from a thickness of a second portion of the semiconductor capping layer contacting a central portion of one of the second semiconductor layers.

7. The semiconductor device as claimed in claim 1, wherein:
each of the fin structures further includes a lower semiconductor region extending in the vertical direction from a respective one of the active regions, and
the stack structure is on the lower semiconductor region.

8. The semiconductor device as claimed in claim 7, wherein a maximum thickness of a portion of the semiconductor capping layer contacting the lower semiconductor region is greater than a minimum thickness of a portion of the semiconductor capping layer contacting one of the first semiconductor layers.

9. The semiconductor device as claimed in claim 1, further comprising:
a base active region extending from the substrate in the vertical direction; and
a second isolation region on side surfaces of the base active region and on the substrate,
wherein the active regions extend from the base active region in the vertical direction, and
wherein the first isolation region is on the base active region.

10. The semiconductor device as claimed in claim 9, wherein the first isolation region includes a gap-fill insulating layer, a buffer insulating layer between the gap-fill insulating layer and the active regions and between the gap-fill insulating layer and the base active region.

11. The semiconductor device as claimed in claim 10, wherein:
the first isolation region further includes an insulating liner between the gap-fill insulating layer and the buffer insulating layer, and
the insulating liner is formed of a material different from a material of the gap-fill insulating layer and a material of the buffer insulating layer.

12. The semiconductor device as claimed in claim 9, wherein:
the first isolation region includes first isolation portions and a second isolation portion,
the active regions and the second isolation portion are between the first isolation portions,
the second isolation portion is between the active regions, and
an upper end of the second isolation portion is at a different level than an upper end of the first isolation portions.

13. The semiconductor device as claimed in claim 12, wherein the upper end of the second isolation portion is at a lower level than the upper end of the first isolation portions.

14. The semiconductor device as claimed in claim 1, wherein:
each of the first semiconductor layers is formed of silicon-germanium, and
each of the second semiconductor layers is formed of silicon.

* * * * *